US012751032B2

(12) United States Patent
Cheng

(10) Patent No.: US 12,751,032 B2
(45) Date of Patent: Sep. 29, 2026

(54) SEMICONDUCTOR DEVICE WITH NANOWIRE HETEROJUNCTION AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 634 days.

(21) Appl. No.: 18/063,867

(22) Filed: Dec. 9, 2022

(65) Prior Publication Data

US 2023/0106052 A1 Apr. 6, 2023

Related U.S. Application Data

(63) Continuation of application No. PCT/CN2020/130919, filed on Nov. 23, 2020.

(51) Int. Cl.

*H10D 30/43* (2025.01)
*B82Y 10/00* (2011.01)
(Continued)

(52) U.S. Cl.

CPC ........... *H10D 30/43* (2025.01); *H10D 30/014* (2025.01); *H10D 30/6735* (2025.01);
(Continued)

(58) Field of Classification Search

CPC .......... H01L 21/02603; H10D 30/6735; H10D 30/015; H10D 30/475; H10D 62/824;
(Continued)

(56) References Cited

U.S. PATENT DOCUMENTS 8,927,405 B2 * 1/2015 Cohen .................... B82Y 10/00 977/762
9,287,360 B1 3/2016 Basu et al.
(Continued)

FOREIGN PATENT DOCUMENTS

CN 103972235 A 8/2014
CN 107546125 A 1/2018
(Continued)

OTHER PUBLICATIONS

International Search Report issued in corresponding PCT Application No. PCT/CN2020/130919, dated Aug. 25, 2021.

*Primary Examiner* — Sonya McCall-Shepard
(74) *Attorney, Agent, or Firm* — Westbridge IP LLC

(57) ABSTRACT

A semiconductor device includes: a substrate, a first support structure, a first nanowire heterojunction, a source, a drain, and a ring-shaped gate. The substrate includes a first region, and a second region and a third region located on respective sides of the first region; the first support structure is located at least on the second region and the third region; the first nanowire heterojunction includes a first gate section corresponding to the first region, a first source section corresponding to the second region, and a first drain section corresponding to the third region; the first source section and the first drain section are located on the first support structure. The source is located on the first source section, the drain is located on the first drain section, and the ring-shaped gate wraps the first gate section.

19 Claims, 25 Drawing Sheets

(51) Int. Cl.

| | |
|---|---|
| ***H10D 30/01*** | (2025.01) |
| ***H10D 30/47*** | (2025.01) |
| ***H10D 30/67*** | (2025.01) |
| ***H10D 62/10*** | (2025.01) |
| ***H10D 62/13*** | (2025.01) |
| ***H10D 62/824*** | (2025.01) |
| ***H10D 62/85*** | (2025.01) |
| ***H10D 64/23*** | (2025.01) |
| ***H10P 14/20*** | (2026.01) |
| ***H10P 14/24*** | (2026.01) |

(52) U.S. Cl.
CPC ......... *H10D 62/121* (2025.01); *H10D 62/824* (2025.01); *H10D 62/8503* (2025.01); *H10P 14/24* (2026.01); *H10P 14/271* (2026.01); *H10P 14/3416* (2026.01); *H10P 14/3462* (2026.01)

(58) Field of Classification Search
CPC .. H10D 30/43; H10D 30/014; H10D 30/4755; H10D 62/82; H10D 30/751; H10D 62/119; H10D 62/121; H10D 30/6757; H10D 62/8503; H10D 30/4732; H10D 64/251; B82Y 10/00; Y10S 977/938; H10P 14/3462
See application file for complete search history.

(56) References Cited

U.S. PATENT DOCUMENTS

| | | | | |
|---|---|---|---|---|
| 9,343,142 | B2 * | 5/2016 | Bangsaruntip | H10D 30/0411 |
| 9,640,615 | B1 * | 5/2017 | Xiao | H10D 30/015 |
| 2022/0131013 | A1 * | 4/2022 | Tang | H10D 30/4732 |

FOREIGN PATENT DOCUMENTS

| | | | |
|---|---|---|---|
| CN | 109427908 | A | 3/2019 |
| CN | 111969056 | A | 11/2020 |

* cited by examiner

SEMICONDUCTOR DEVICE WITH NANOWIRE HETEROJUNCTION AND MANUFACTURING METHOD THEREOF

CROSS-REFERENCE TO RELATED APPLICATIONS

This application is a continuation of International Application No. PCT/CN2020/130919, filed on Nov. 23, 2020, the entire contents of which are incorporated herein by reference.

TECHNICAL FIELD

This application relates to the field of semiconductor technology, and in particular to a semiconductor device and a manufacturing method thereof.

BACKGROUND

As a typical representative of the third-generation semiconductor materials, the wide-bandgap semiconductor material group III nitride has the excellent characteristics of large bandgap width, high pressure resistance, high temperature resistance, high electron saturation speed and drift speed, and easy formation of high-quality heterojunctions, which makes it very suitable for manufacturing high-temperature, high-frequency, high-power electronic devices.

For example, due to the strong spontaneous polarization and piezoelectric polarization of AlGaN/GaN heterojunction, there is a high concentration of two-dimensional electron gas (2DEG) at the AlGaN/GaN interface, which is widely used in high electron mobility transistors (HEMTs) and other semiconductor structures.

In a planar device, the current flows along the plane in the quantum well formed by the heterojunction structure. Under the reverse bias condition of the device, the electric field distribution is usually uneven. Generally speaking, serious electric field concentration will be generated at the edge of the gate or the edge of the drain, and the electric field there will increase rapidly with the reverse voltage. When the critical breakdown field strength is reached, the device is broken down.

The high breakdown voltage means that the voltage range of the device is larger, higher power density can be obtained, and the reliability of the device is higher. Therefore, how to increase the breakdown voltage of the device is a key concern of the researchers of electronic devices.

SUMMARY

The purpose of the present application is to provide a semiconductor device and a manufacturing method thereof to improve the breakdown voltage.

To achieve the above objective, a first aspect of the present application provides a semiconductor device, including:

- a substrate, the substrate including a first region, and a second region and a third region located on respective sides of the first region;
- a first support structure located at least on the second region and the third region;
- a first nanowire heterojunction, the first nanowire heterojunction including a first gate section corresponding to the first region, a first source section corresponding to the second region, and a first drain section corresponding to the third region; the first source section and the first drain section being located on the first support structure; and
- a source located on the first source section, a drain located on the first drain section, and a ring-shaped gate wrapping the first gate section.

Optionally, the first support structure is located only on the second region and the third region.

Optionally, the substrate further includes a fourth region located between the first region and the second region, and a fifth region located between the first region and the third region; the first support structure is located on the second region and the fourth region and is located on the third region and the fifth region.

Optionally, a gate insulating layer is further provided between the first gate section and the ring-shaped gate.

Optionally, the first nanowire heterojunction includes a first channel layer and a first barrier layer from bottom to top, or includes a first back barrier layer, a first channel layer, and a first barrier layer; and/or the first nanowire heterojunction is wrapped by a first anti-scattering layer.

Optionally, the semiconductor device comprises two or more first nanowire heterojunctions.

Optionally, the two or more first nanowire heterojunctions share the first source section and/or the first drain section.

Optionally, the ring-shaped gates wrapping each of the first nanowire heterojunctions are separated from each other, or the ring-shaped gates wrapping each of the first nanowire heterojunctions are connected together.

Optionally, the semiconductor device further includes:

- at least a second support structure located on the first source region and the first drain section;
- a second nanowire heterojunction, the second nanowire heterojunction including a second gate section corresponding to the first region, a second source section corresponding to the second region, and a second drain section of the third region; the second source section and the second drain section are located on the second support structure.

Optionally, the semiconductor device comprises two or more second nanowire heterojunctions.

Optionally, the two or more second nanowire heterojunctions share the second source section and/or the second drain section.

Optionally, the ring-shaped gate wraps one of the second nanowire heterojunctions and one of the first nanowire heterojunctions right below the one of the second nanowire heterojunctions.

Another aspect of the present application provides a manufacturing method for a semiconductor device, including:

- providing a substrate, the substrate including a first region, and a second region and a third region located on respective sides of the first region; forming a first support structure at least on the second region and the third region; forming a first sacrificial layer on the substrate exposed by the first support structure;
- growing a first nanowire heterojunction on the first support structure and the first sacrificial layer, the first nanowire heterojunction including a first gate section corresponding to the first region, a first source section corresponding to the second region, and a first drain section corresponding to the third region; the first source section and the first drain section being located on the first support structure, at least the first gate section being located on the first sacrificial layer;

removing the first sacrificial layer to suspend the first nanowire heterojunction; and forming a source on the first source section, forming a drain on the first drain section, and forming a ring-shaped gate wrapping the first gate section.

Optionally, the first support structure is located only on the second region and the third region; after removing the first sacrificial layer, the suspended first nanowire heterojunction extends from the first source section to the first drain section.

Optionally, the substrate further includes a fourth region located between the first region and the second region, and a fifth region located between the first region and the third region; the first support structure is located on the second region and the fourth region and is located on the third region and the fifth region; after removing the first sacrificial layer, the suspended first nanowire heterojunction is only the first gate section.

Optionally, before forming the ring-shaped gate, wrapping a gate insulating layer on the first gate section; the ring-shaped gate wrapping the gate insulating layer.

Optionally, the semiconductor device comprises two or more first nanowire heterojunctions.

Optionally, the two or more first nanowire heterojunctions share the first source section and/or the first drain section.

Optionally, forming the first support structure includes: growing a first epitaxial layer on the substrate; patterning the first epitaxial layer and at least retaining the first epitaxial layer on the second region and the third region to form the first support structure; or forming a first patterned mask layer on the substrate, the first patterned mask layer having a first opening, and the first opening exposing at least the second region and the third region; epitaxially growing the first support structure on the substrate using the first patterned mask layer as a mask.

Optionally, the forming the first sacrificial layer includes: growing a first sacrificial layer on the first support structure and the substrate exposed by the first support structure, and removing the first sacrificial layer; or growing the first sacrificial layer on the substrate using the first support structure as a mask.

Optionally, the manufacturing method for the semiconductor device further includes:

forming a second support structure at least on the first source section and the first drain section; forming a second sacrificial layer on the first nanowire heterojunction exposed by the second support structure;

growing a second nanowire heterojunction on the second support structure and the second sacrificial layer, wherein the second nanowire heterojunction includes a second gate section corresponding to the first region, a second source section corresponding to the second region and a second drain section corresponding to the third region; the second source section and the second drain section is located on the second support structure, at least the second gate section is located on the second sacrificial layer; and removing the second sacrificial layer and suspending the second nanowire heterojunction.

Optionally, forming the second support structure includes: growing a second epitaxial layer on the first heterojunction nanowire; patterning the second epitaxial layer and at least retaining the second epitaxial layer on the first source section and the first drain section to form the second support structure; or forming a second patterned mask layer on the first nanowire heterojunction, the second patterned mask layer having a second opening, and the second opening at least exposing the first source section and the first drain section; epitaxially growing the second support structure on the first nanowire heterojunction using the second patterned mask layer as a mask.

Optionally, forming the second sacrificial layer includes: growing a second sacrificial layer on the second support structure and the substrate exposed by the second support structure, removing the second sacrificial layer on the second support structure; or growing a second sacrificial layer on the substrate using the second support structure as a mask.

Optionally, the material of the first sacrificial layer and/or the second sacrificial layer is N-type GaN.

Optionally, removing the first sacrificial layer and/or removing the second sacrificial layer is achieved by using a selective etching solution.

BRIEF DESCRIPTION OF THE DRAWINGS

FIG. 2(*c*) is a schematic view of the first nanowire heterojunction of FIG. 2(*a*) wrapped by a first anti-scattering layer.

FIG. 14(*c*) is a schematic view of the second nanowire heterojunction of FIG. 14(*a*) wrapped by a second anti-scattering layer.

DETAILED DESCRIPTION OF THE EMBODIMENTS

In order to make the above objectives, features and advantages of the present application more obvious and understandable, specific embodiments of the present application will be described in detail below with reference to the accompanying drawings.

Figure 1:
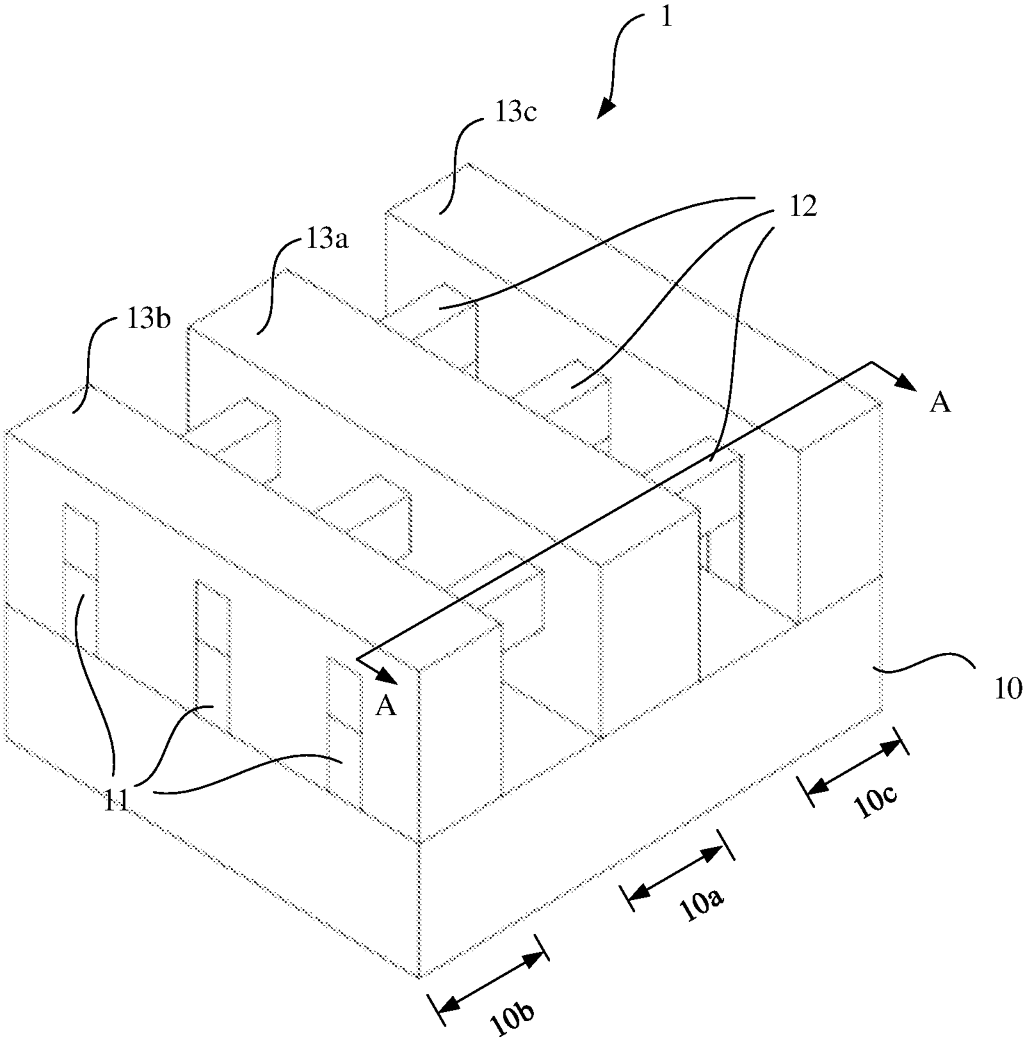
FIG. 1 is a schematic perspective view of a semiconductor device of a first embodiment of the present application.
Figure 2A:
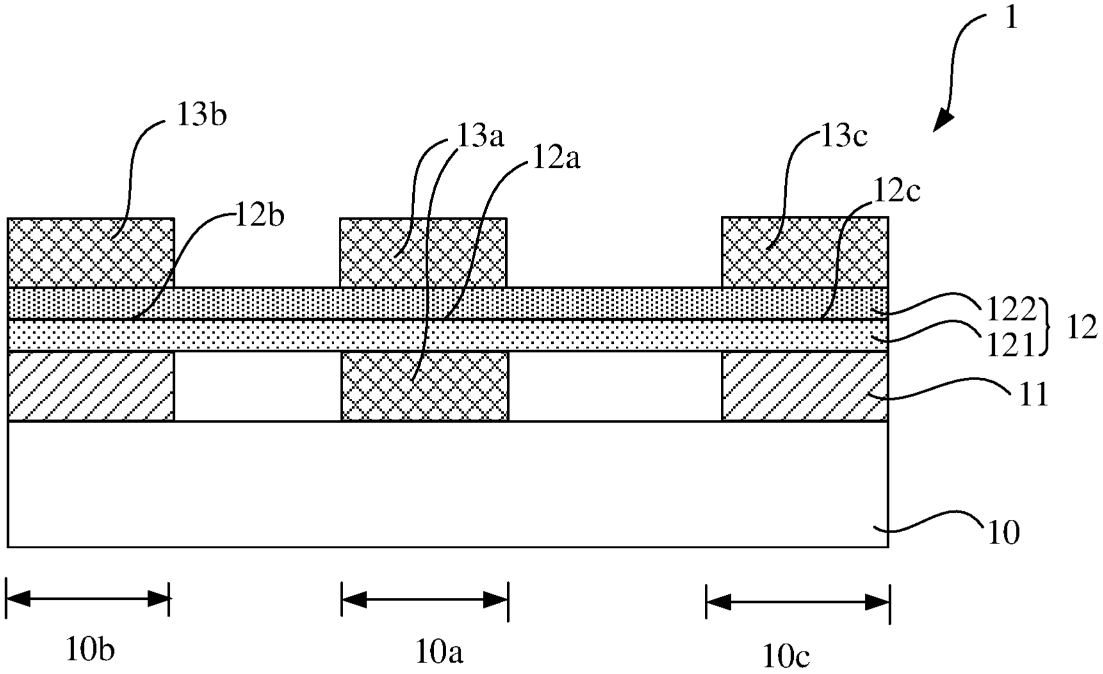
FIG. 2(*a*) and FIG. 2(*b*) are cross-sectional views along the line AA in FIG. 1, where the first nanowire heterojunction structures are different.
Figure 2B:
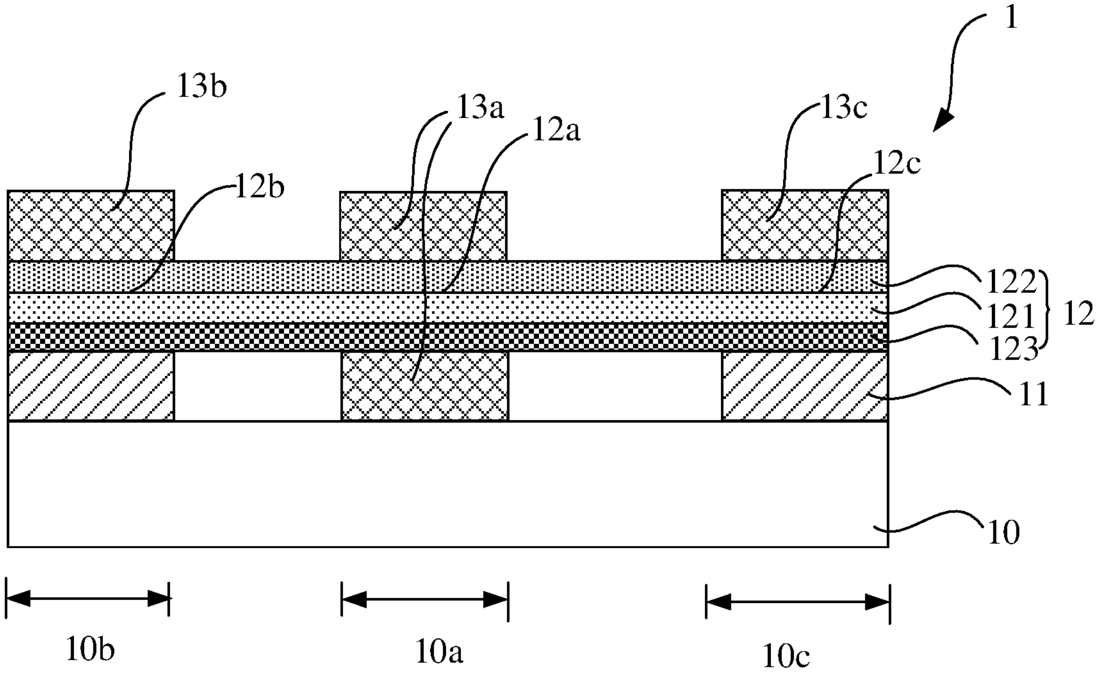
Figure 2C:
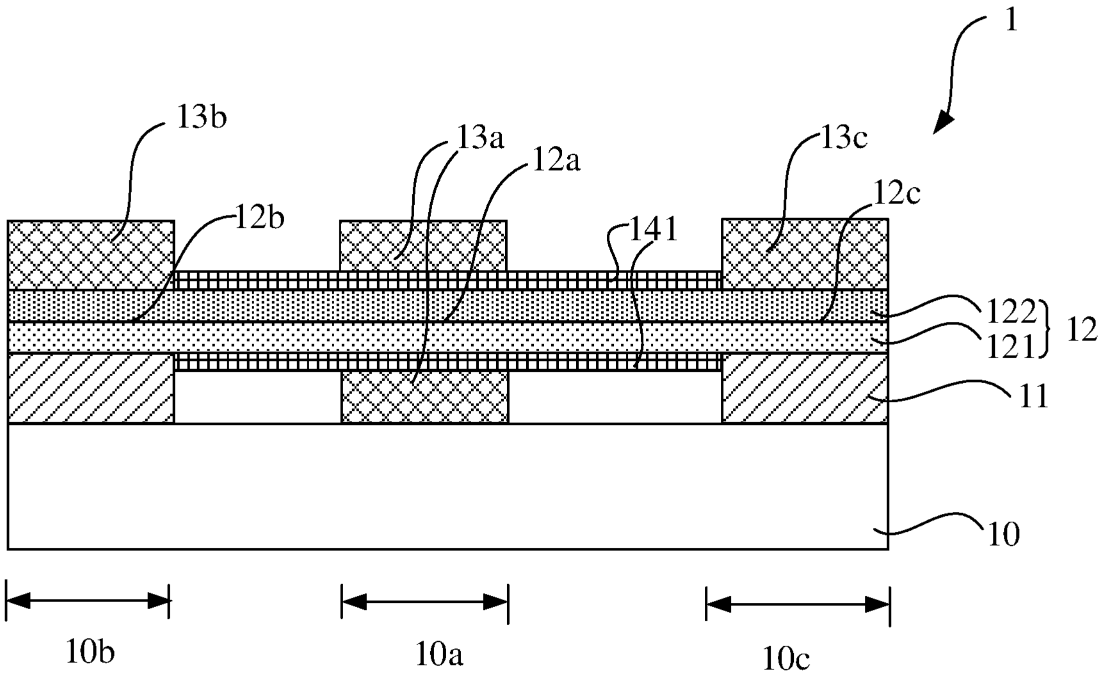
Figure 3:
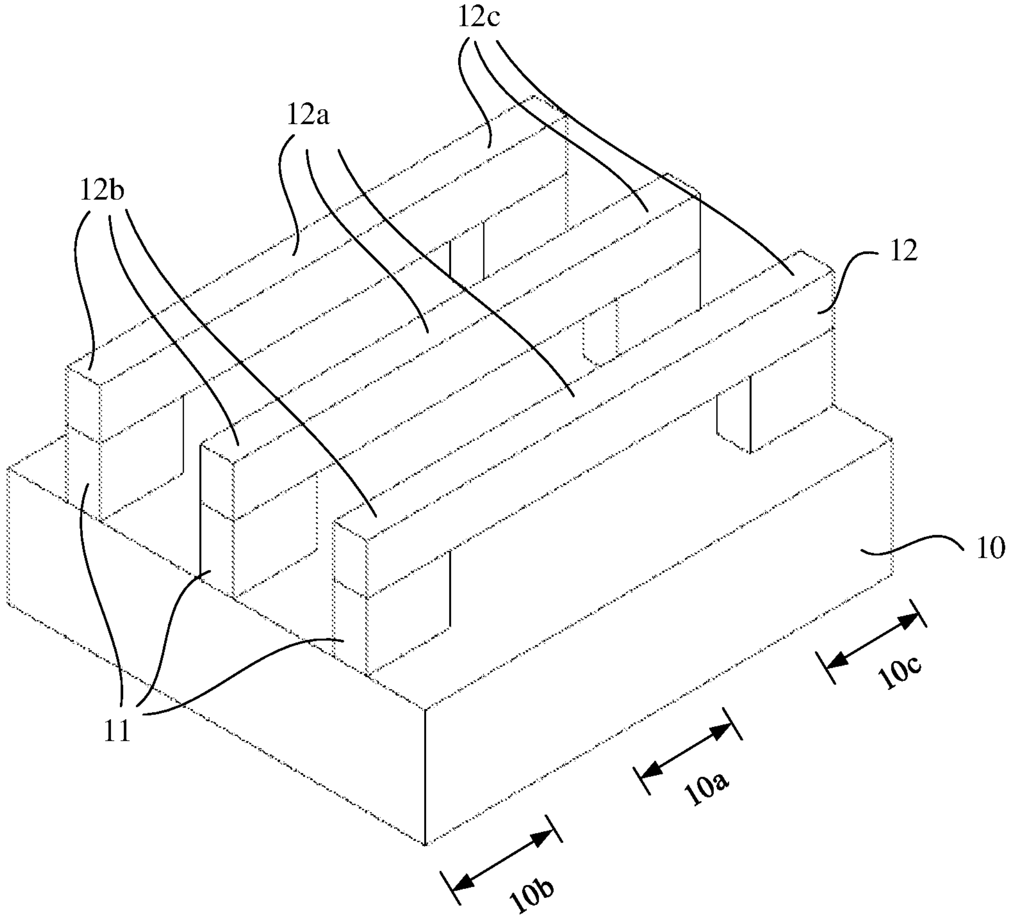
FIG. 3 is a schematic perspective view of the semiconductor structure after removing the source electrode, the drain electrode, and the ring-shaped gate in FIG. 1.

FIG. 1 is a schematic perspective view of a semiconductor device of a first embodiment of the present application. FIG. 2(*a*) and FIG. 2(*b*) are cross-sectional views along the line AA in FIG. 1, where the first nanowire heterojunction structures are different. FIG. 2(*c*) is a schematic view of the first nanowire heterojunction of FIG. 2(*a*) wrapped by a first anti-scattering layer. FIG. 3 is a schematic perspective view of the semiconductor structure after removing the source electrode, the drain electrode, and the ring-shaped gate in FIG. 1.

Referring to FIG. 1 to FIG. 3, the semiconductor device 1 comprises:

- a substrate 10 including a first region 10*a*, and a second region 10*b* and a third region 10*c* located on respective sides of the first region 10*a;*
- a first support structure 11 located on the second region 10*b* and the third region 10*c;*
- a first nanowire heterojunction 12, where the first nanowire heterojunction 12 comprises the first gate section 12*a* corresponding to the first region 10*a*, a first source section 12*b* corresponding to the second region 10*b*, and a first drain section 12*c* corresponding to the third region 10*c*; the first source section 12*b* and the first drain section 12*c* are located on the first support structure 11; and
- a source 13*b* located on the first source section 12*b*, a drain 13*c* located on the first drain section 12*c*, and a ring-shaped gate 13*a* wrapping the first gate section 12*a*.

In this embodiment, the material of the substrate 10 may be sapphire, silicon carbide, silicon, silicon on insulator (SOI), diamond, or lithium niobate.

There may be a buffer layer on the substrate 10, and there may be a nucleation layer between the buffer layer and the substrate 10. The material of the nucleation layer may be a group III nitride-based material, such as AlN, AlGaN, and the like. The material of the buffer layer may also be a group III nitride-based material, such as at least one of GaN, AlN, InN, AlGaN, InGaN, AlInN and AlInGaN. The nucleation layer can alleviate the problem of lattice mismatch and thermal mismatch between the epitaxially grown semiconductor layer and the substrate 10. The buffer layer can reduce the dislocation density and defect density of the epitaxially grown semiconductor layer, such as the first support structure 11, thereby improving the crystal quality.

The material of the first support structure 11 may be a group III nitride-based material, such as at least one of GaN, AlN, InN, AlGaN, InGaN, AlInN, and AlInGaN, or a dielectric material, such as silicon dioxide.

Referring to FIG. 3, the length dimension of the first nanowire heterojunction 12 is much larger than the two-dimensional dimension in the vertical profile. The vertical profile is the profile along the thickness direction.

Referring to FIG. 2(*a*), in one embodiment, the first nanowire heterojunction 12 may include a first channel layer 121 and a first barrier layer 122 from bottom to top. A two-dimensional electron gas or a two-dimensional hole gas may be formed at the interface between the first channel layer 121 and the first barrier layer 122. In an optional solution, the first channel layer 121 is an intrinsic GaN layer, and the first barrier layer 122 is an N-type AlGaN layer. In other optional solutions, the material of the first channel layer 121 and the first barrier layer 122 may also be at least one of GaN, AlN, InN, AlGaN, InGaN, AlInN, and AlInGaN. In addition, except that the first channel layer 121 and the first barrier layer 122 shown in FIG. 2(*a*) have one layer respectively, the first channel layer 121 and the first barrier layer 122 may also respectively have multiple layers, and be alternately distributed; or there could be one layer of the first channel layer 121 and two or more layers of the first barrier layer 122 to form a multi-barrier structure.

Referring to FIG. 2(*b*), in one embodiment, the first nanowire heterojunction 12 may also include a first back barrier layer 123, a first channel layer 121 and a first barrier layer 122 from bottom to top. The first back barrier layer 123, the first channel layer 121, and the first barrier layer 122 may each have one layer; the first back barrier layer 123, the first channel layer 121, and the first barrier layer 122 may also respectively have multiple layers, and be alternately distributed. Compared with the embodiment shown in FIG. 2(*a*), the advantage of this embodiment is that the first back barrier layer 123 and the first barrier layer 122 can confine the carriers in the first channel layer 121 to prevent the carriers from leaking. In other embodiments, the first nanowire heterojunction 12 may also include only the first back barrier layer 123 and the first channel layer 121 from bottom to top.

Referring to FIG. 2(*c*), in an embodiment, the first nanowire heterojunction 12 shown in FIG. 2(*a*) is wrapped by a first anti-scattering layer 141. In other embodiments, the first anti-scattering layer 141 may also wrap the first nanowire heterojunction 12 shown in FIG. 2(*b*). The first anti-scattering layer 141 can reduce the scattering of carriers on the outer surface of the first nanowire heterojunction 12 and prevent the carriers from leaking.

The first anti-scattering layer 141 may sequentially include an AlN layer and an AlGaN layer from inside to outside.

In this embodiment, the number of the first nanowire heterojunctions 12 is three. In other embodiments, the number of the first nanowire heterojunctions 12 may be one or two.

In some embodiments, the first nanowire heterojunctions 12 may share the first source section 12*b* and/or share the first drain section 12*c*. That is, the first source sections 12*b* of each of the first nanowire heterojunctions 12 are connected together, and/or the first drain sections 12*c* of each of the first nanowire heterojunctions 12 are connected together.

Ohmic contacts are formed between the source 13*b* and the first source section 12*b*, between the drain 13*c* and the first drain section 12*c*, and between the ring-shaped gate 13*a* and the first gate section 12*a*. The source 13*b*, the drain 13*c*, and the ring-shaped gate 13*a* may be made of metal, such as Ti/Al/Ni/Au, Ni/Au and other existing conductive materials.

In some embodiments, a N-type ion heavily doped layer can be used to form ohmic contacts between the source 13*b* and the first source section 12*b*, between the drain 13*c* and the first drain section 12*c*, and between the ring-shaped gate 13*a* and the first gate section 12*a*. The N-type ion heavily doped layer can directly form the ohmic contact layer between the source 13*b* and the first source section 12*b*, between the drain 13*c* and the first drain section 12*c*, and between the ring-shaped gate 13*a* and the first gate section 12*a* without high temperature annealing, which avoids the performance degradation and the reduction of the electron migration rate of the first nanowire heterojunction 12 that are caused by the high temperature in the annealing process.

In the N-type ion heavily doped layer, the N-type ion may be at least one of Si ion, Ge ion, Sn ion, Se ion and Te ion. For different N-type ions, the doping concentration can be greater than $1E18/cm^3$. The N-type ion heavily doped layer may be a group III nitride-based material, for example, at least one of GaN, AlN, InN, AlGaN, InGaN, AlInN, and AlInGaN.

In the semiconductor device 1, since the first nanowire heterojunction 12 is confined, the two-dimensional electron gas carriers or the two-dimensional hole gas carriers in the heterojunction 12 exhibit approximately one-dimensional transport during the migration process. In this way, the carrier mobility can be improved. In addition, the ability of the ring-shaped gate 13*a* to control carriers is also greatly improved, so that the breakdown voltage of the device can be greatly increased, the leakage problem can be reduced, and the efficiency and linearity of the radio frequency device can be improved.

Figure 4:
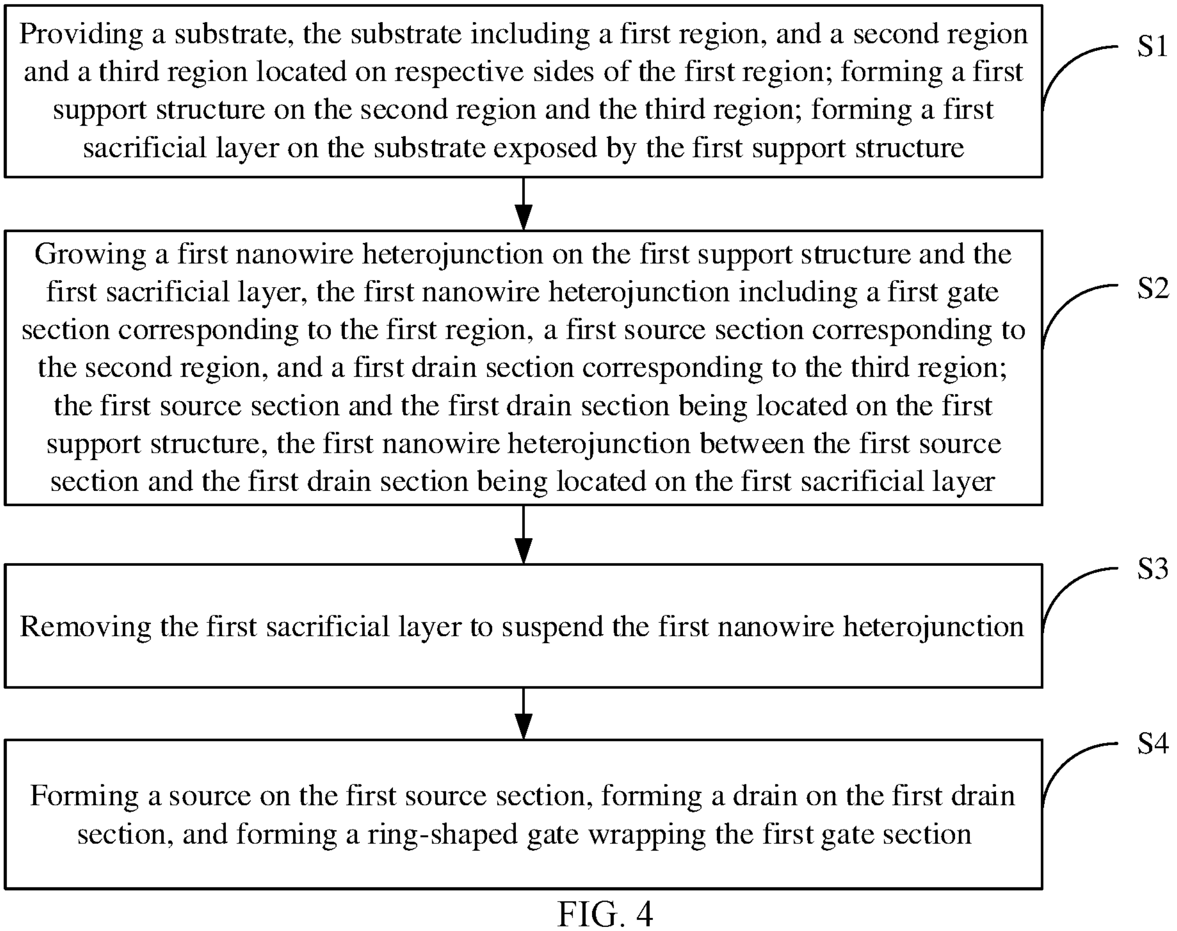
FIG. 4 is a flowchart of a manufacturing method for the semiconductor device in FIG. 1 to FIG. 2(*c*).

The first embodiment of the present application also provides a manufacturing method for the semiconductor device in FIG. 1 to FIG. 2(*c*). FIG. 4 is a flowchart of the manufacturing method. FIG. 5 to FIG. 8(*b*) are schematic intermediate structure views corresponding to the processes in FIG. 4.

Figure 5:
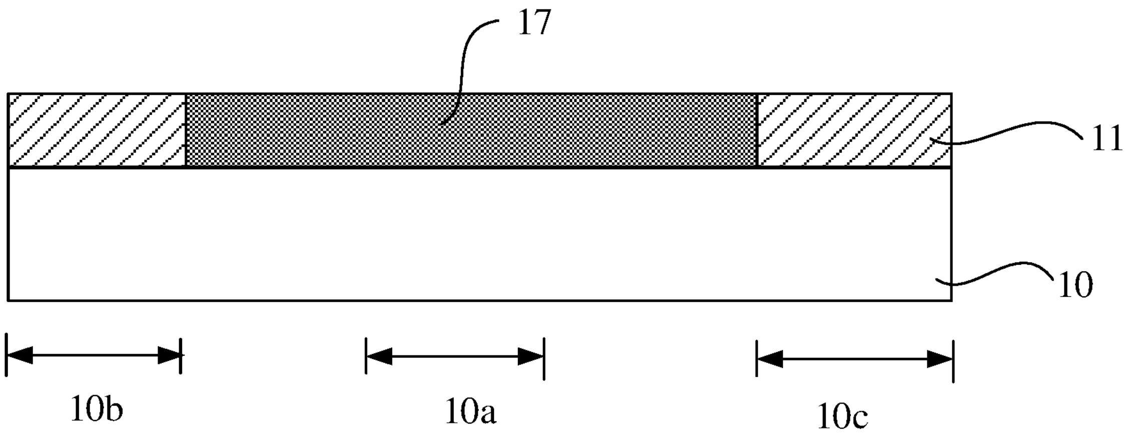
FIGS. 5, 6, 7(*a*), 7(*b*), 8(*a*) and 8(*b*) are schematic intermediate structure views corresponding to the processes in FIG. 4.

First, referring to step S1 in FIG. 4 as well as FIG. 5, a substrate 10 is provided. The substrate 10 comprises a first region 10*a*, and a second region 10*b* and a third region 10*c* located on respective sides of the first region 10*a*. A first support structure 11 is formed on the second region 10*b* and the third region 10*c*. A first sacrificial layer 17 is formed on the substrate 10 exposed by the first support structure 11.

In this embodiment, the material of the substrate 10 may be sapphire, silicon carbide, silicon, silicon on insulator (SOI), diamond, or lithium niobate.

Before forming the first support structure 11, a nucleation layer and a buffer layer may be grown on the substrate 10 in sequence. The material of the nucleation layer may be a group III nitride-based material, such as AlN, AlGaN, and the like. The material of the buffer layer may also be a group III nitride-based material, such as at least one of GaN, AlN, InN, AlGaN, InGaN, AlInN and AlInGaN. The nucleation layer can alleviate the problem of lattice mismatch and thermal mismatch between the epitaxially grown semiconductor layer and the substrate 10. The buffer layer can reduce the dislocation density and defect density of the epitaxially grown semiconductor layer, such as the first support structure 11, thereby improving the crystal quality.

The epitaxial growth process of the nucleation layer and/or the buffer layer may include atomic layer deposition (ALD), or chemical vapor deposition (CVD), or molecular beam epitaxy (MBE), or plasma enhanced chemical vapor deposition (PECVD), or low pressure chemical vapor deposition (LPCVD), or metal-organic chemical vapor deposition (MOCVD), or a combination thereof.

Figure 6:
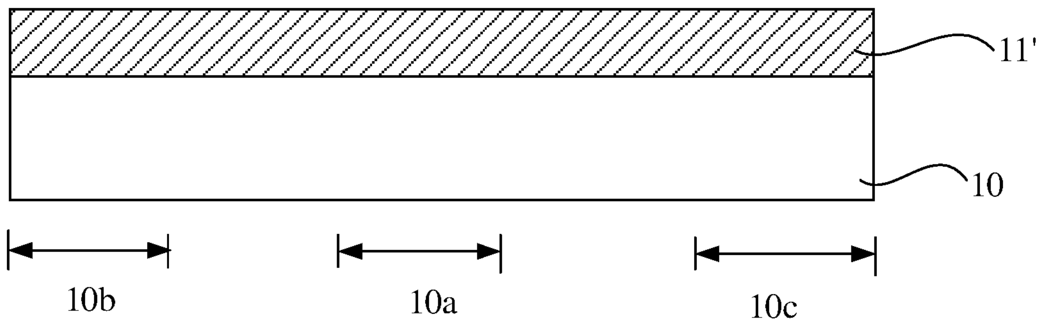

In this embodiment, forming the first support structure 11 specifically includes: as shown in FIG. 6, growing a first epitaxial layer 11' on the substrate 10; as shown in FIG. 5, patterning the first epitaxial layer 11', leaving the first epitaxial layer 11' on the second region 10*b* and the third region 10*c* to form the first support structure 11.

The material of the first epitaxial layer 11' may be a group III nitride-based material, such as at least one of GaN, AlN, InN, AlGaN, InGaN, AlInN, and AlInGaN. The patterning of the first epitaxial layer 11' can be achieved by dry etching or wet etching.

In other embodiments, the first epitaxial layer 11' can also be replaced with a first material layer. The material of the first material layer is, for example, silicon nitride, silicon dioxide, silicon oxynitride, etc. The first material layer can be formed by physical vapor deposition or chemical vapor deposition.

In other embodiments, forming the first support structure 11 may specifically include: forming a first patterned mask layer on the substrate 10, where the first patterned mask layer has a first opening, and the first opening exposes the second region 10*b* and the third region 10*c*; using the first patterned mask layer as a mask to epitaxially grow a first support structure 11 on the substrate 10. After that, the first patterned mask layer is removed.

The material of the first patterned mask layer is, for example, silicon nitride, silicon dioxide, silicon oxynitride, etc. The first patterned mask layer can be formed by physical vapor deposition or chemical vapor deposition.

The material of the first support structure 11 may be a group III nitride-based material, such as at least one of GaN, AlN, InN, AlGaN, InGaN, AlInN, and AlInGaN.

In this embodiment, forming the first sacrificial layer 17 specifically includes growing the first sacrificial layer 17 on a first support structure 11 and a part of the substrate 10 that is exposed by the first support structure 11, removing the first sacrificial layer 17 on the first support structure 11.

The material of the first sacrificial layer 17 may be a GaN-based material, for example, N-type GaN. The epitaxial growth process of the first sacrificial layer 17 may refer to the epitaxial growth process of the nucleation layer and/or the buffer layer. The first sacrificial layer 17 on the first support structure 11 can be removed by dry etching or wet etching.

In other embodiments, the material of the first sacrificial layer 17 may also be, for example, silicon nitride, silicon dioxide, etc. The first sacrificial layer 17 can be formed by physical vapor deposition or chemical vapor deposition.

In other embodiments, forming the first sacrificial layer 17 may specifically include: growing the first sacrificial layer 17 on the substrate 10 using the first support structure 11 as a mask. This embodiment is applicable to the case where the material of the first support structure 11 is silicon nitride, silicon dioxide, etc., and the first sacrificial layer 17 cannot be grown on it.

Referring to FIG. 5, in this embodiment, the first sacrificial layer 17 on the substrate 10 is flush with the upper surface of the first support structure 11. In other embodiments, the upper surface of the first sacrificial layer 17 on the substrate 10 may be higher than the upper surface of the first support structure 11 or lower than the upper surface of the first support structure 11.

Figure 7A:
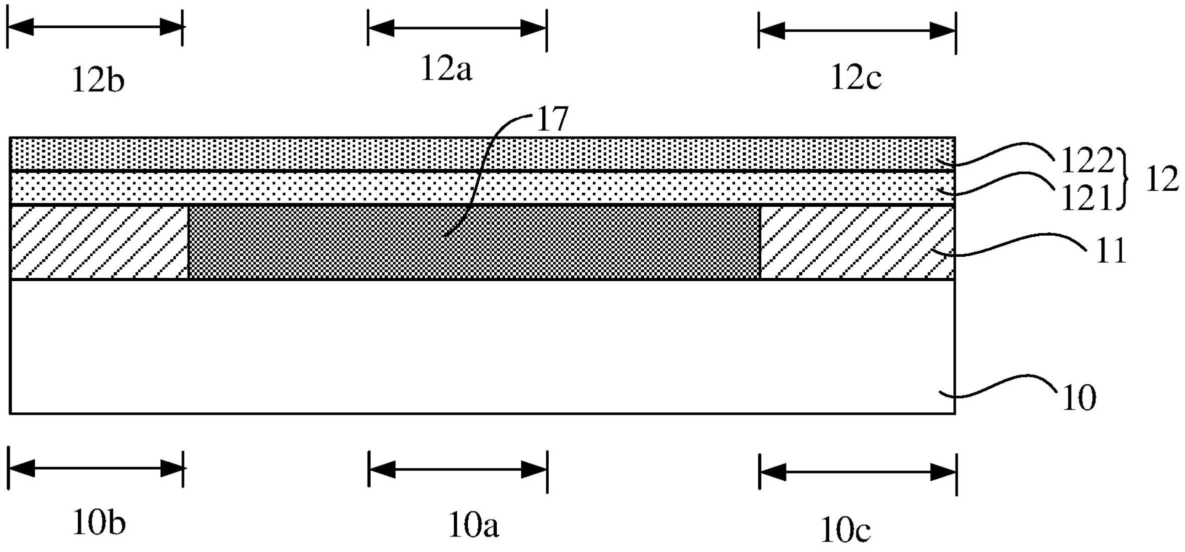
Figure 7B:
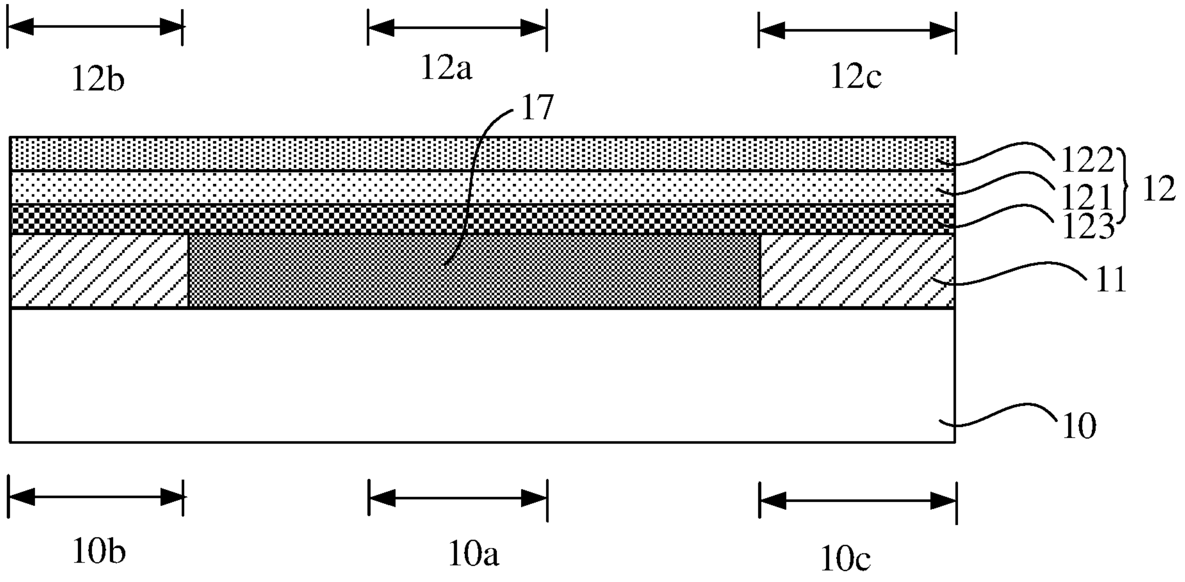

Next, with reference to the step S2 in FIG. 4 as well as FIG. 7 (*a*) and FIG. 7 (*b*), a first nanowire heterojunction 12 is grown on the first support structure 11 and the first sacrificial layer 17. The first nanowire heterojunction 12 includes a first gate section 12*a* corresponding to the first region 10*a*, a first source section 12*b* corresponding to the second region 10*b*, and a first drain section 12*c* corresponding to the third region 10*c*. The first source section 12*b* and the first drain section 12*c* are located on the first support structure 11. A part of the first nanowire heterojunction 12 between the first source section 12*b* and the first drain section 12*c* is located on the first sacrificial layer 17.

Referring to FIG. 7(*a*), in one embodiment, the first nanowire heterojunction 12 may include a first channel layer 121 and a first barrier layer 122 from bottom to top. A two-dimensional electron gas or a two-dimensional hole gas may be formed at the interface between the first channel layer 121 and the first barrier layer 122. In an optional solution, the first channel layer 121 is an intrinsic GaN layer, and the first barrier layer 122 is an N-type AlGaN layer. In other optional solutions, the material of the first channel layer 121 and the first barrier layer 122 may also be at least one of GaN, AlN, InN, AlGaN, InGaN, AlInN, and AlInGaN. In addition, except that the first channel layer 121 and the first barrier layer 122 shown in FIG. 7(*a*) have one layer respectively; the first channel layer 121 and the first barrier layer 122 may also respectively have multiple layers, and be alternately distributed; or there could be one layer of the first channel layer 121 and two or more layers of the first barrier layer 122 to form a multi-barrier structure.

Referring to FIG. 7(*b*), in one embodiment, the first nanowire heterojunction 12 may also include a first back barrier layer 123, a first channel layer 121 and a first barrier layer 122 from bottom to top. The first back barrier layer 123, the first channel layer 121, and the first barrier layer 122 may each have one layer; the first back barrier layer 123, the first channel layer 121, and the first barrier layer 122 may also respectively have multiple layers, and be alternately distributed. Compared with the embodiment shown in FIG. 7(*a*), the advantage of this embodiment is that the first back barrier layer 123 and the first barrier layer 122 can confine the carriers in the first channel layer 121 to prevent the carriers from leaking. In other embodiments, the first nanowire heterojunction 12 may also include only the first back barrier layer 123 and the first channel layer 121 from bottom to top.

The following steps are described with respect to the structure shown in FIG. 7(*a*).

The epitaxial growth process of the first nanowire heterojunction 12 can refer to the epitaxial growth process of the nucleation layer and/or the buffer layer.

In this embodiment, referring to FIG. 3, the number of the first nanowire heterojunctions 12 is three. In other embodiments, the number of the first nanowire heterojunctions 12 may also be one, two, and so on.

Figure 8A:
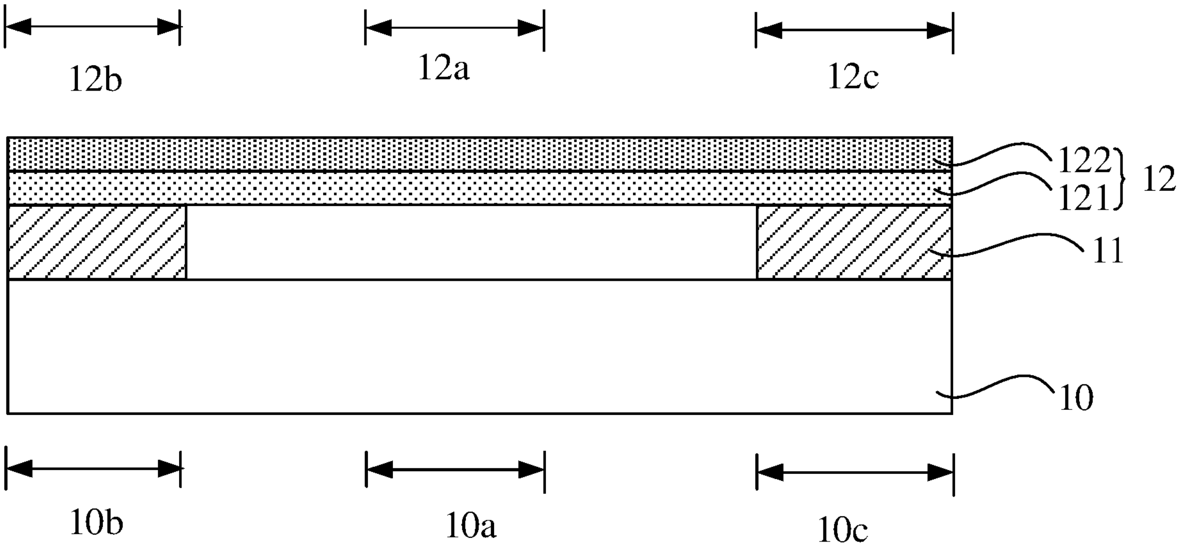
Figure 8B:
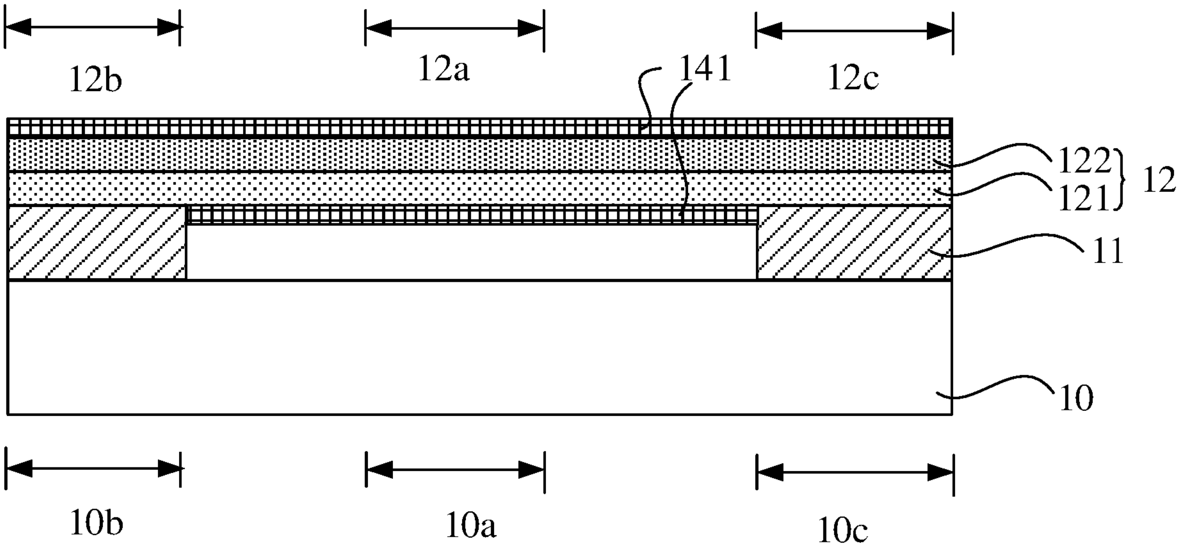

After that, referring to step S3 in FIG. 4 as well as FIG. 8(*a*) and FIG. 3, the first sacrificial layer 17 is removed, and the first nanowire heterojunction 12 is suspended.

When the material of the first sacrificial layer 17 is N-type GaN, the removal method is wet solution etching, such as boric acid.

In some embodiments, the material of the first sacrificial layer 17 may be a GaN-based material, and the upper surface is an N-face. The material of the first nanowire heterojunction 12 may also be a GaN-based material, and the upper surface is a Ga-face. The etching solution for wet etching can be $H_3PO_4$ solution or KOH solution, which is corrosive on the N-face and non-corrosive on the Ga-face. GaN crystal is a wurtzite structure, where the Ga, N atomic layers are ABABAB hexagonal stacking layers, each Ga(N) atom forms a bond with the surrounding 4 N(Ga) atoms in a diamond-like tetrahedral structure. Taking Ga—N bonds parallel to the C axis ([0001] crystal orientation) as a reference, if the Ga atoms in each Ga—N bond are farther away from the lower surface, the upper surface is the Ga-face; if the N atoms in each Ga—N bond are farther away from the lower surface, the upper surface is the N-face. In this embodiment, the first sacrificial layer 17 can be removed by selective etching of the N-face using $H_3PO_4$ solution or KOH solution.

When the material of the first sacrificial layer 17 is silicon nitride, it is removed by hot phosphoric acid; when the material of the first sacrificial layer 17 is silicon dioxide, it is removed by hydrofluoric acid.

Afterwards, in some embodiments, referring to FIG. 8(*b*), the first anti-scattering layer 141 may also wrap the suspended first nanowire heterojunction 12. The first anti-scattering layer 141 can reduce the scattering of carriers on the outer surface of the first nanowire heterojunction 12 and prevent the carriers from leaking.

The first anti-scattering layer 141 may sequentially include an AlN layer and an AlGaN layer from inside to outside.

The method for forming the first anti-scattering layer 141 can refer to the epitaxial growth process of the nucleation layer and/or the buffer layer.

Then, referring to step S4 in FIG. 4 as well as FIG. 1 to FIG. 2(*c*), a source 13*b* is formed on the first source section 12*b*, a drain 13*c* is formed on the first drain section 12*c*, and a ring-shaped gate 13*a* wrapping the first gate section 12*a* is formed.

The source 13*b*, the drain 13*c*, and the ring-shaped gate 13*a* may be made of metal, such as Ti/Al/Ni/Au, Ni/Au and other existing conductive materials. Correspondingly, the entire surface can be formed by a deposition process first, and then patterned by an etching process.

When the first anti-scattering layer 141 wraps the suspended first nanowire heterojunction 12, the ring-shaped gate 13*a* wraps the first anti-scattering layer 141 of the first gate section 12*a*.

In this embodiment, referring to FIG. 1, the ring-shaped gates 13*a* wrapping each of the first nanowire heterojunctions 12 are connected together and contact the substrate 10.

In some embodiments, before forming the source 13*b*, the drain 13*c*, and the ring-shaped gate 13*a*, a N-type ion heavily doped layer is formed on the first source section 12*b*, the first drain section 12*c*, and the first gate section 12*a*. The N-type ion heavily doped layer may be a group III nitride-based material, for example, at least one of GaN, AlN, InN, AlGaN, InGaN, AlInN, and AlInGaN. In the N-type ion heavily doped layer, the N-type ion may be at least one of Si ion, Ge ion, Sn ion, Se ion and Te ion. For different N-type ions, the doping concentration can be greater than 1E18/$cm^3$.

The N-type ion heavily doped layer can directly form the ohmic contact layer between the source 13*b* and the first source section 12*b*, between the drain 13*c* and the first drain section 12*c*, and between the ring-shaped gate 13*a* and the first gate section 12*a* without high temperature annealing, which avoids the performance degradation and the reduction of the electron migration rate of the first nanowire heterojunction 12 that are caused by the high temperature in the annealing process.

Figure 9:
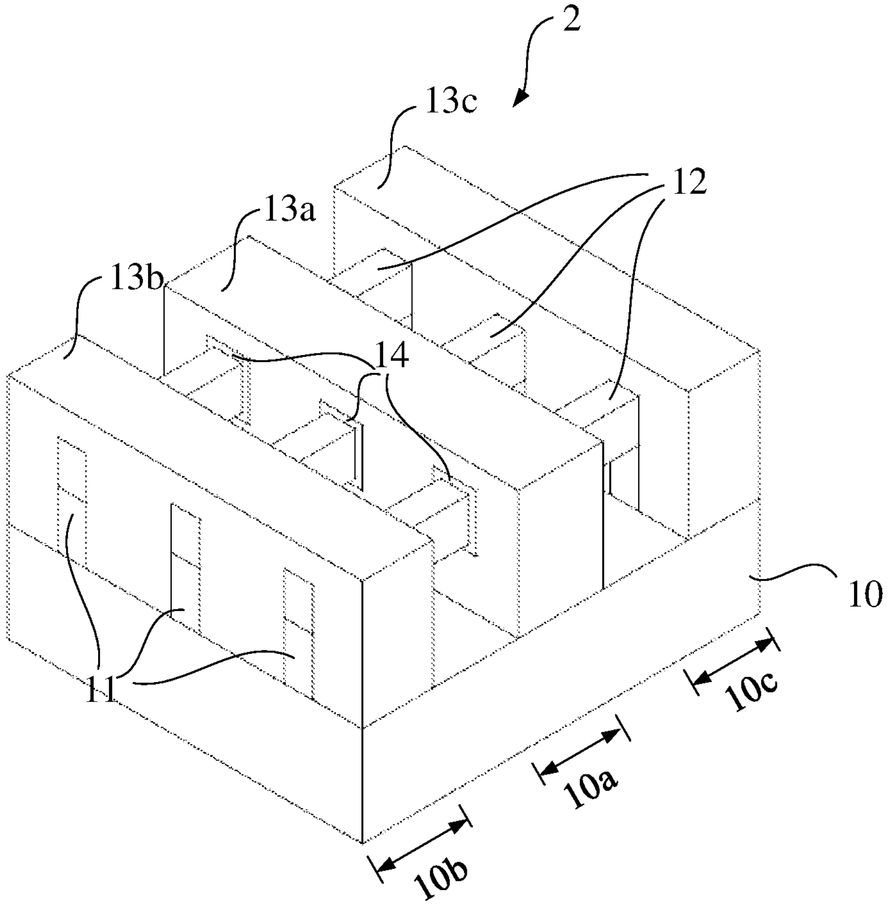
FIG. 9 is a schematic perspective view of a semiconductor device of a second embodiment of the present application.
Figure 10:
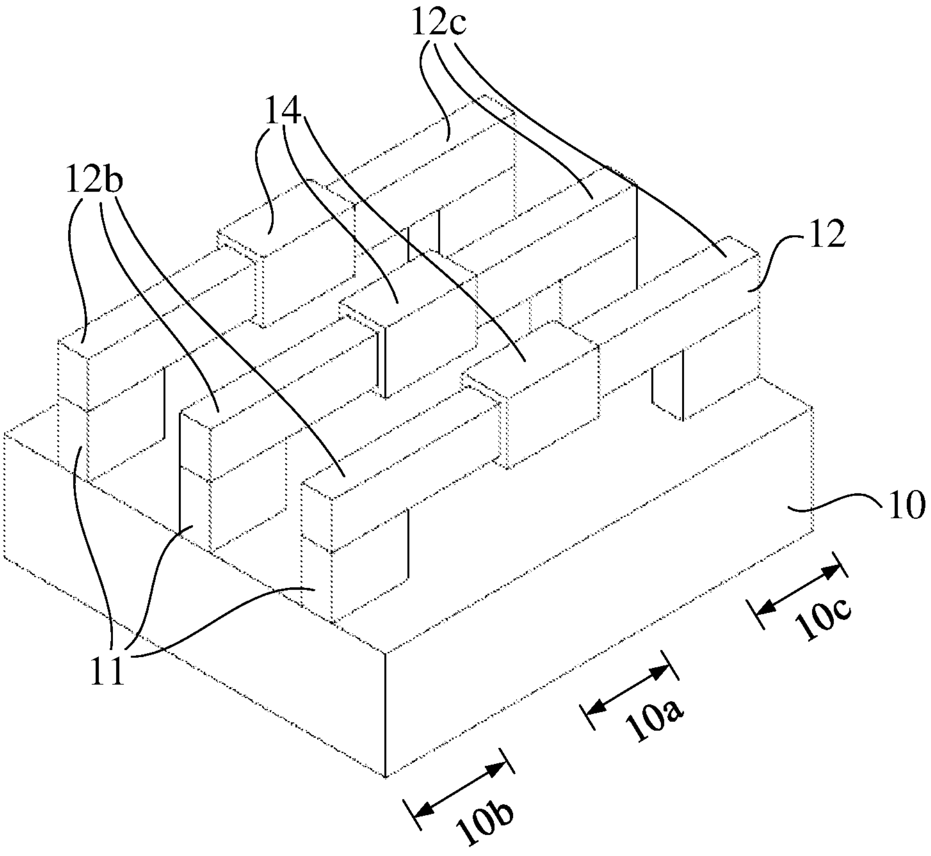
FIG. 10 is a schematic perspective view of the semiconductor structure after removing the source electrode, the drain electrode, and the ring-shaped gate in FIG. 9.

FIG. 9 is a schematic perspective view of a semiconductor device of a second embodiment of the present application. FIG. 10 is a schematic perspective view of the semiconductor structure after removing the source electrode, the drain electrode, and the ring-shaped gate in FIG. 9.

Referring to FIG. 9 and FIG. 10, the structure of a semiconductor device 2 of the second embodiment and the structure of the semiconductor device 1 of the first embodiment are substantially the same, only except that there is a gate insulating layer 14 between the first gate section 12*a* and the ring-shaped gate 13*a*. In other words, the semiconductor device 2 has a MIS gate, and the MIS gate can reduce gate current leakage.

Correspondingly, the manufacturing method for the semiconductor device 2 of the second embodiment is substantially the same as the manufacturing method for the semiconductor device 1 of the first embodiment, only except that in step S4, the first gate section 12*a* is first wrapped by a gate insulating layer 14; the ring-shaped gate 13*a* wraps the gate insulating layer 14 afterwards.

Specifically, a deposition process may be used to sequentially form an insulating material layer and a metal layer over the entire surface, and then patterning is implemented in one process through an etching process.

Figure 11:
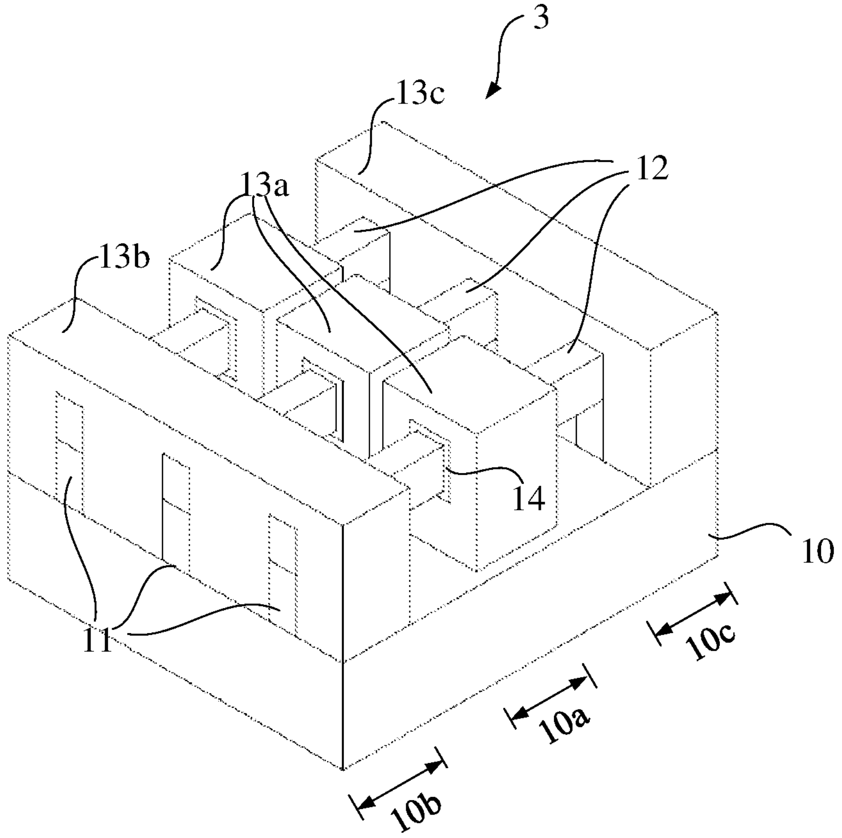
FIG. 11 is a schematic perspective view of a semiconductor device of a third embodiment of the present application.

FIG. 11 is a schematic perspective view of a semiconductor device of a third embodiment of the present application.

Referring to FIG. 11, the structure of a semiconductor device 3 of the third embodiment and the structures of the semiconductor devices 1 and 2 of the first embodiment and the second embodiment are substantially the same, only except that the ring-shaped gates 13*a* wrapping each of the first nanowire heterojunctions 12 are separated from each other.

Accordingly, the manufacturing method for the semiconductor device 3 of the third embodiment is substantially the same as the manufacturing methods for the semiconductor devices 1 and 2 of the first embodiment and the second embodiment, only except that in step S4, the etching process, when patterning the metal layer, not only removes the metal layer between the first source section 12*b* and the first gate section 12*a*, and the metal layer between the first drain section 12*c* and the first gate section 12*a*, but also disconnects the metal layers between each of the first nanowire heterojunctions 12.

Figure 12:
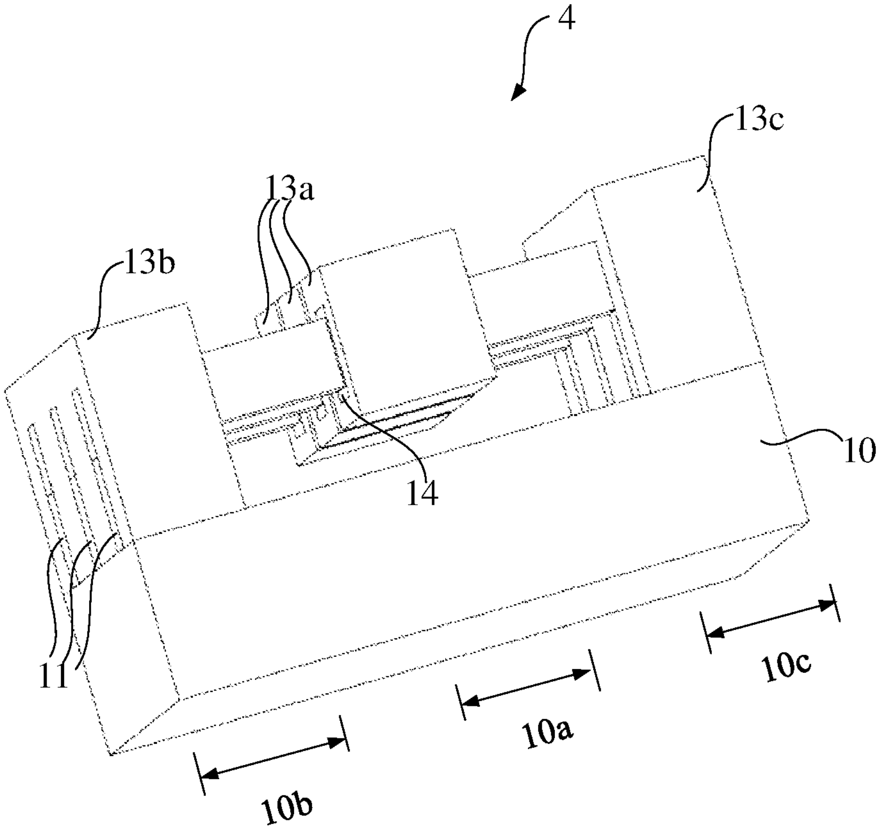
FIG. 12 is a schematic perspective view of a semiconductor device of a fourth embodiment of the present application.

FIG. 12 is a schematic perspective view of a semiconductor device of a fourth embodiment of the present application.

Referring to FIG. 12, the structure of a semiconductor device 4 of the fourth embodiment and the structures of the semiconductor devices 1, 2, and 3 of the first, second, and third embodiments are substantially the same, only except that there is a gap between the ring-shaped gate 13*a* and the substrate 10.

Correspondingly, the manufacturing method for the semiconductor device 4 of the fourth embodiment is substantially the same as the manufacturing methods for the semiconductor devices 1, 2, and 3 of the first, second, and third embodiments, only except that in step S4, the thickness of the metal layer deposited on the first gate section 12*a* is reduced.

Figure 13:
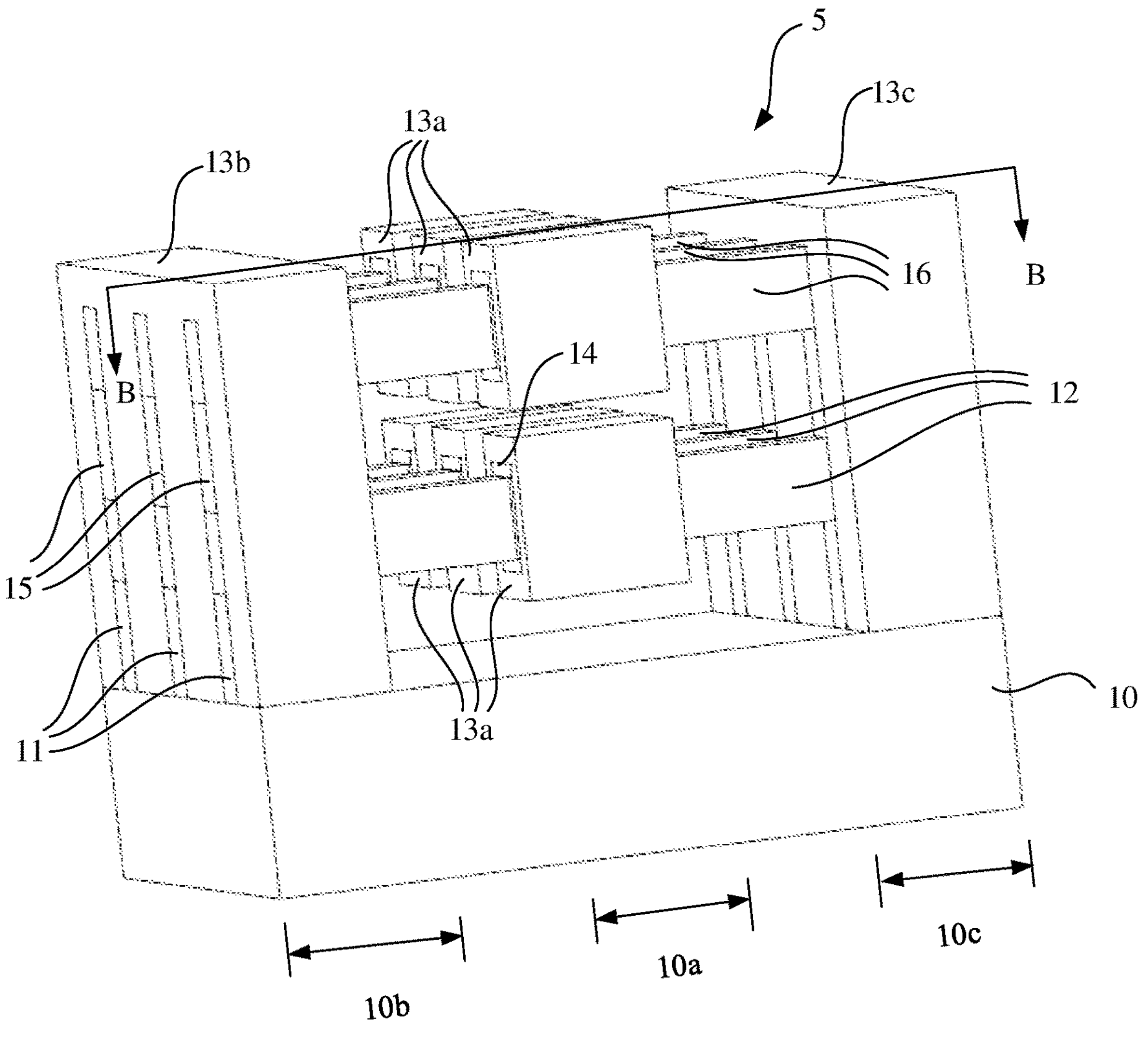
FIG. 13 is a schematic perspective view of a semiconductor device of a fifth embodiment of the present application.
Figure 14A:
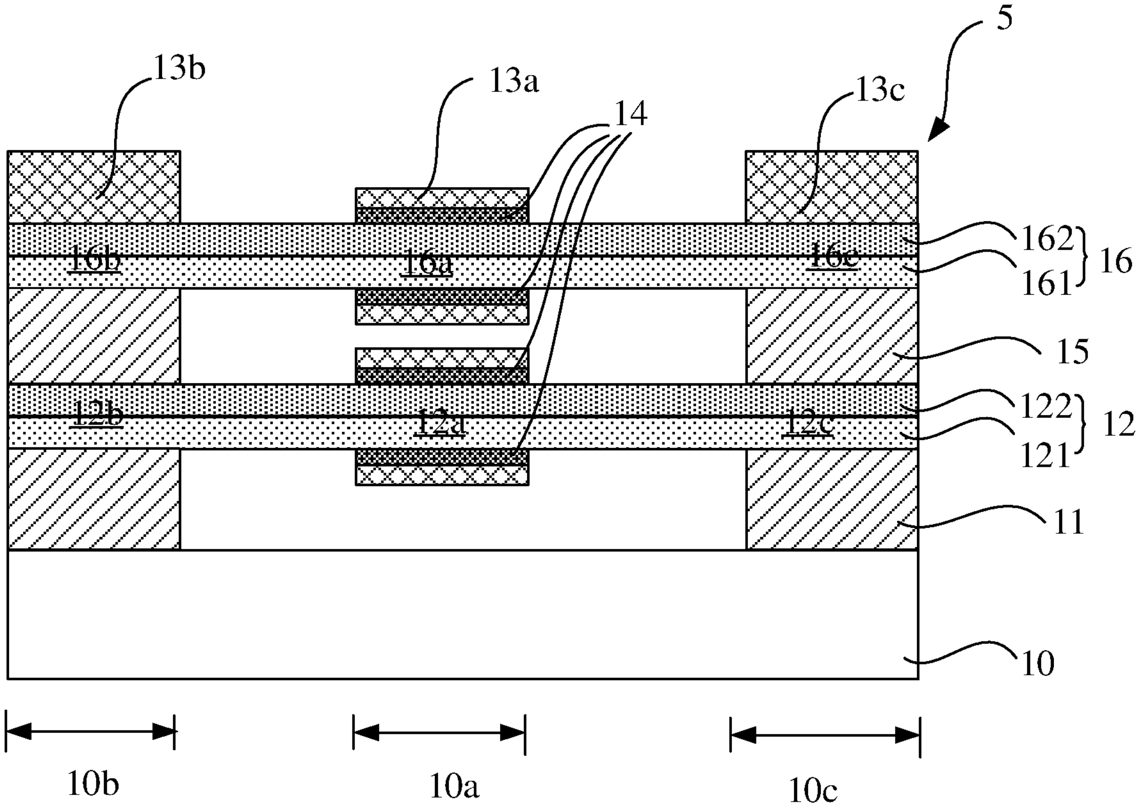
FIG. 14(*a*) and FIG. 14(*b*) are cross-sectional views along the line BB in FIG. 13, where the second nanowire heterojunction structures are different.
Figure 14B:
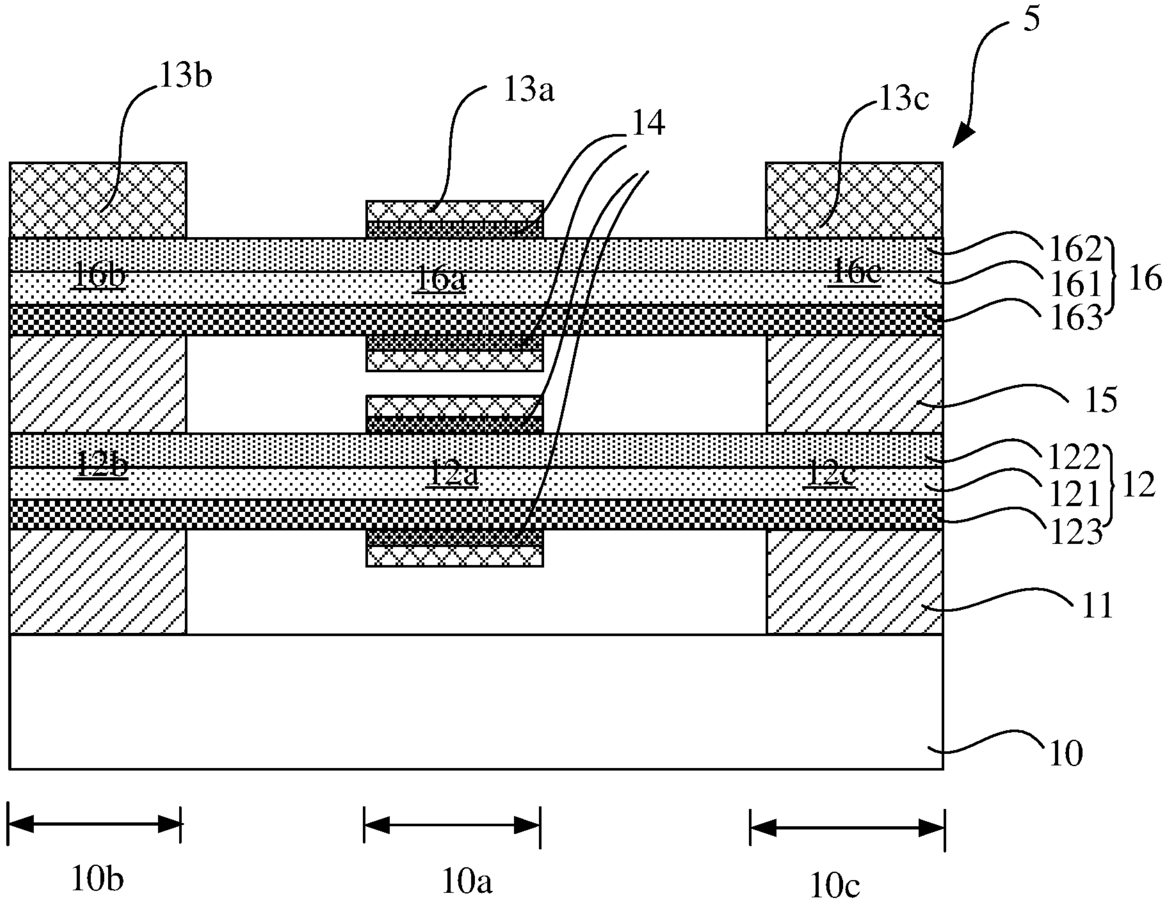
Figure 14C:
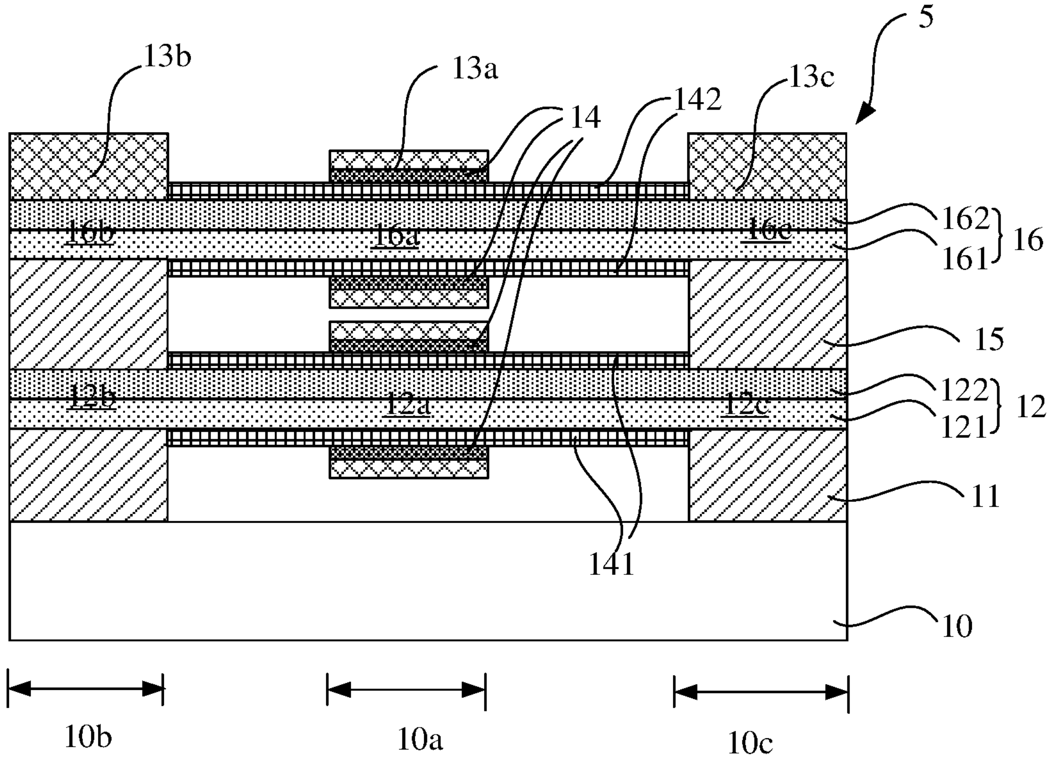
Figure 15:
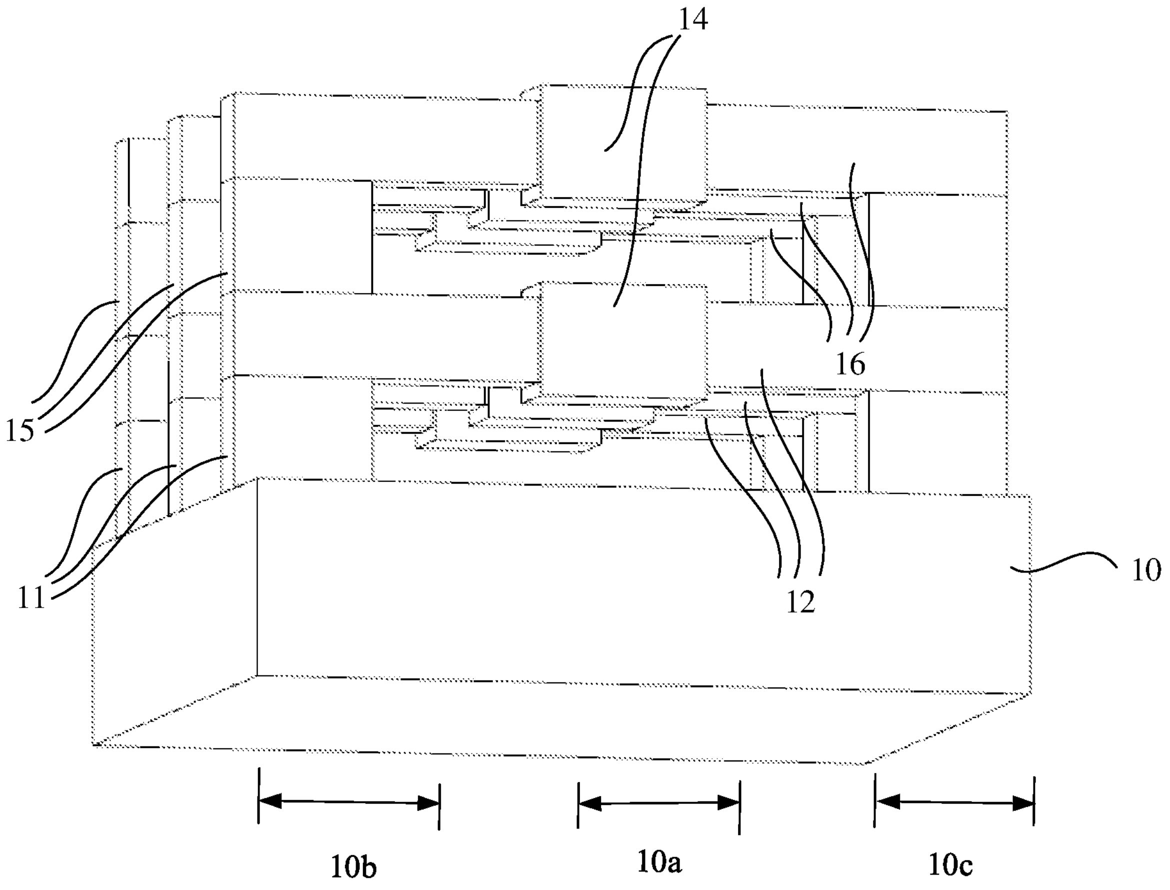
FIG. 15 is a schematic perspective view of the semiconductor structure after removing the source electrode, the drain electrode, and the ring-shaped gate in FIG. 13.
Figure 16:
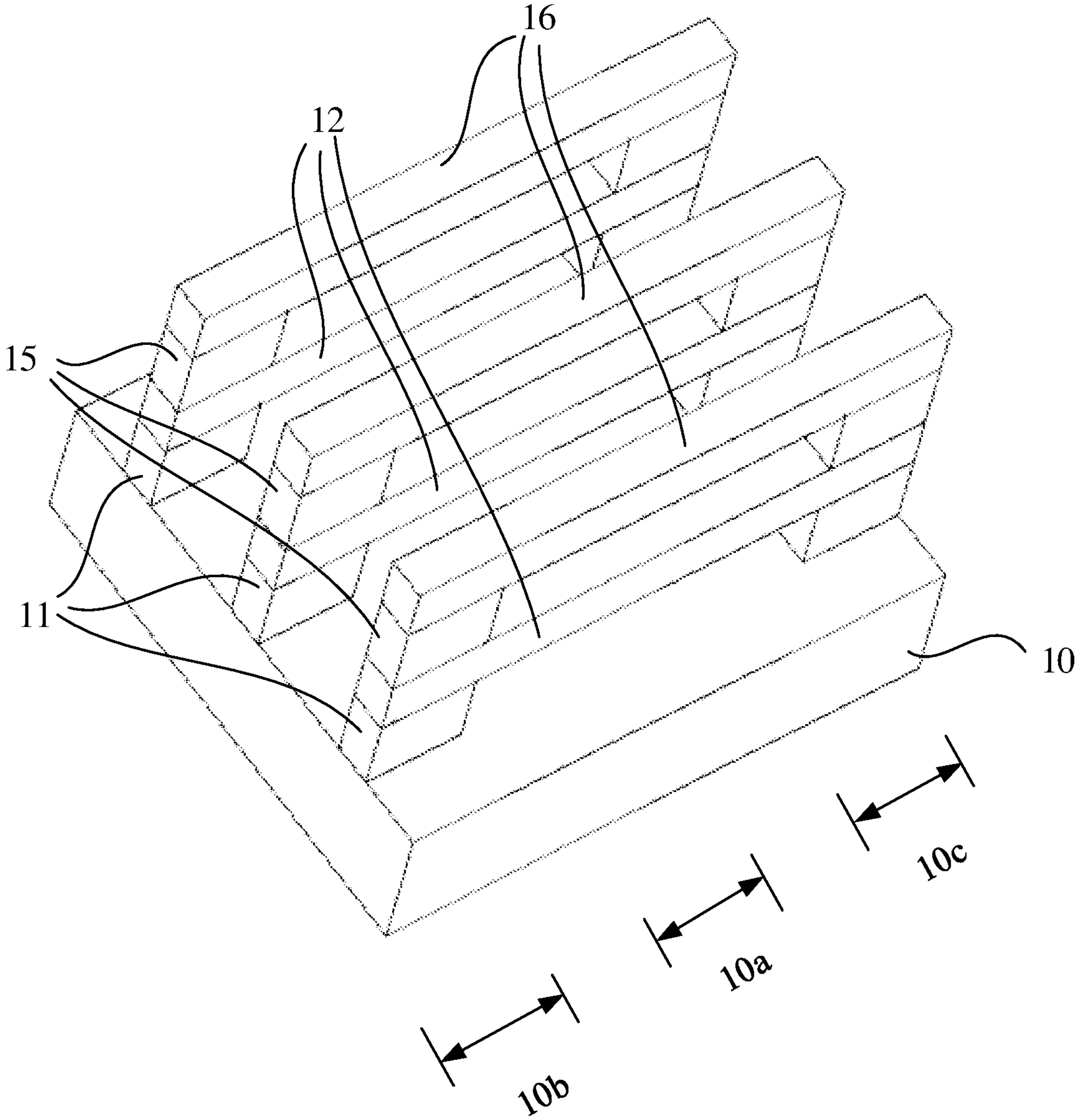
FIG. 16 is a schematic perspective view of the semiconductor structure after removing the gate insulating layer in FIG. 15.

FIG. 13 is a schematic perspective view of a semiconductor device of a fifth embodiment of the present application. FIG. 14(*a*) and FIG. 14(*b*) are cross-sectional views along the line BB in FIG. 13, where the second nanowire heterojunction structures are different. FIG. 14(*c*) is a schematic view of the second nanowire heterojunction of FIG. 14(*a*) wrapped by a second anti-scattering layer. FIG. 15 is a schematic perspective view of the semiconductor structure after removing the source electrode, the drain electrode, and the ring-shaped gate in FIG. 13. FIG. 16 is a schematic perspective view of the semiconductor structure after removing the gate insulating layer in FIG. 15.

Referring to FIG. 13 to FIG. 16, the structure of a semiconductor device 5 of the fifth embodiment is substantially the same as the structure of the semiconductor device 4 of the fourth embodiment, except that the semiconductor device 5 further includes:

a second support structure 15 located on the first source section 12*b* and the first drain section 12*c*; and a second nanowire heterojunction 16, where the second nanowire heterojunction 16 comprises a second gate section 16*a* corresponding to the first region 10*a*, a second source section 16*b* corresponding to the second region 10*b*, and a second drain section 16*c* corresponding to the third region 10*c*. The second source section 16*b* and the second drain section 16*c* are located on the second support structure 15.

The shape and size of the second nanowire heterojunction 16 may be the same as the shape and size of the first nanowire heterojunction 12.

The material of the second support structure 15 can refer to the material of the first support structure 11.

Referring to FIG. 14(*a*), in one embodiment, the second nanowire heterojunction 16 may include a second channel layer 161 and a second barrier layer 162 from bottom to top. A two-dimensional electron gas or a two-dimensional hole gas may be formed at the interface between the second channel layer 161 and the second barrier layer 162. In an alternative solution, the second channel layer 161 is an intrinsic GaN layer, and the second barrier layer 162 is an N-type AlGaN layer. In other optional solutions, the materials of the second channel layer 161 and the second barrier layer 162 may also be at least one of GaN, AlN, InN, AlGaN, InGaN, AlInN, and AlInGaN. In addition, in addition to the second channel layer 161 and the second barrier layer 162 shown in FIG. 14(*a*) having one layer respectively; the second channel layer 161 and the second barrier layer 162 may also have multiple layers respectively, and be alternately distributed; or one second channel layer 161 and two or more second barrier layers 162 to form a multi-barrier structure.

Referring to FIG. 14(*b*), in an embodiment, the second nanowire heterojunction 16 may also include a second back barrier layer 163, a second channel layer 161, and a second barrier layer 162 from bottom to top. The second back barrier layer 163, the second channel layer 161, and the second barrier layer 162 may each have one layer; the second back barrier layer 163, the second channel layer 161, and the second barrier layer 162 may also each have multiple layers, and be alternately distributed. Compared with the embodiment shown in FIG. 14(*a*), the advantage of this embodiment is that the second back barrier layer 163 and the second barrier layer 162 can confine the carriers in the second channel layer 161 to prevent the carriers from leaking. In other embodiments, the second nanowire heterojunction 16 may also include only the second back barrier layer 163 and the second channel layer 161 from bottom to top.

Referring to FIG. 14(*c*), in one embodiment, the second nanowire heterojunction 16 shown in FIG. 14(*a*) is wrapped by a second anti-scattering layer 142. In other embodiments, the second anti-scattering layer 142 may also wrap the second nanowire heterojunction 16 shown in FIG. 14(*b*). The second anti-scattering layer 142 can reduce the scattering of carriers on the outer surface of the second nanowire heterojunction 16 and prevent the carriers from leaking.

The second anti-scattering layer 142 may sequentially include an AlN layer and an AlGaN layer from inside to outside.

The ring-shaped gate 13*a* wrapping each of the first heterojunction nanowires 12 and the ring-shaped gate 13*a* wrapping each of the second heterojunction nanowires 16 are separated from each other. In addition, there is a gap between the ring-shaped gate 13*a* wrapping each of the first nanowire heterojunctions 12 and the substrate 10.

Figure 17:
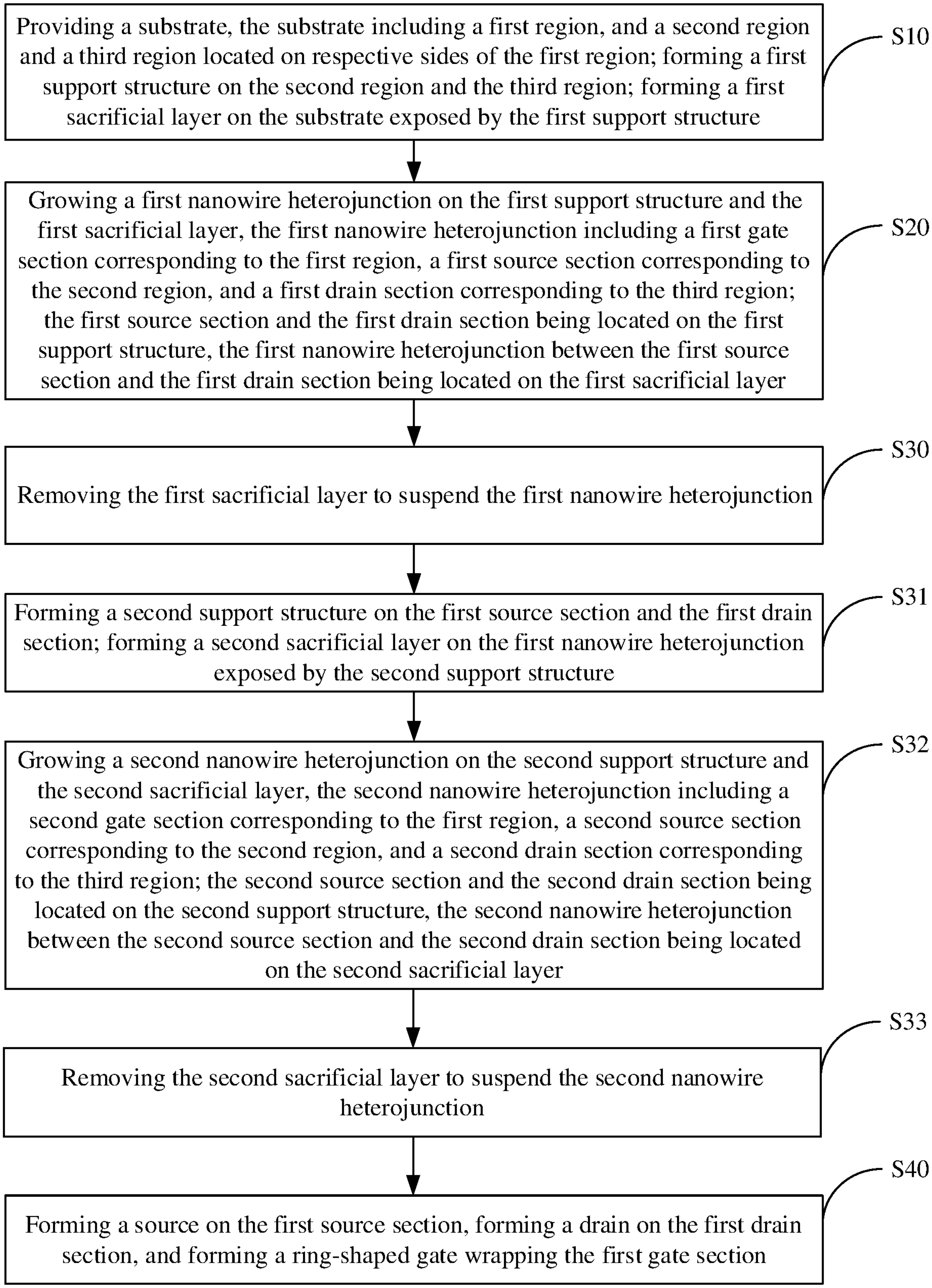
FIG. 17 is a flowchart of a manufacturing method for the semiconductor device in FIG. 13 to FIG. 14(*c*).
Figure 18:
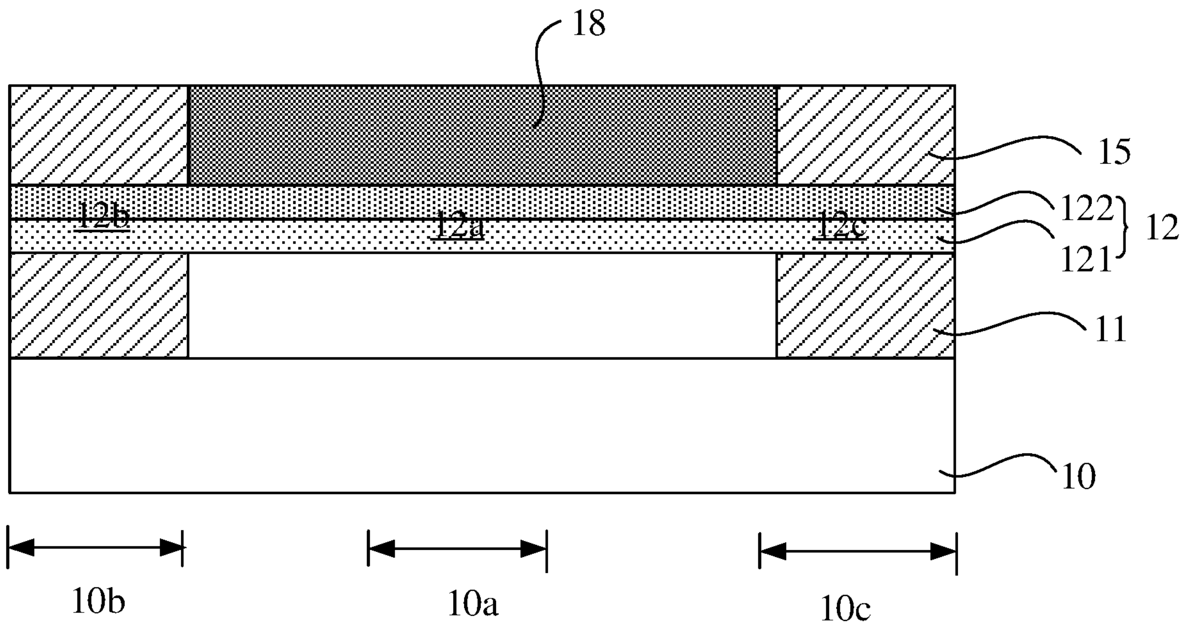
FIG. 18 to FIG. 20 are schematic intermediate structure views corresponding to the processes in FIG. 17.
Figure 19:
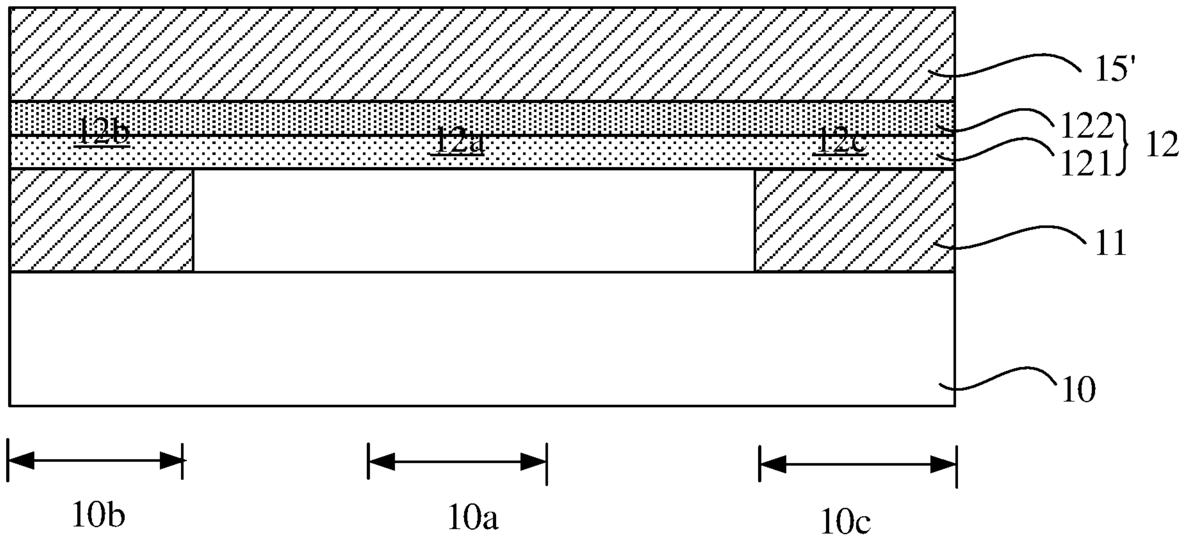
Figure 20:
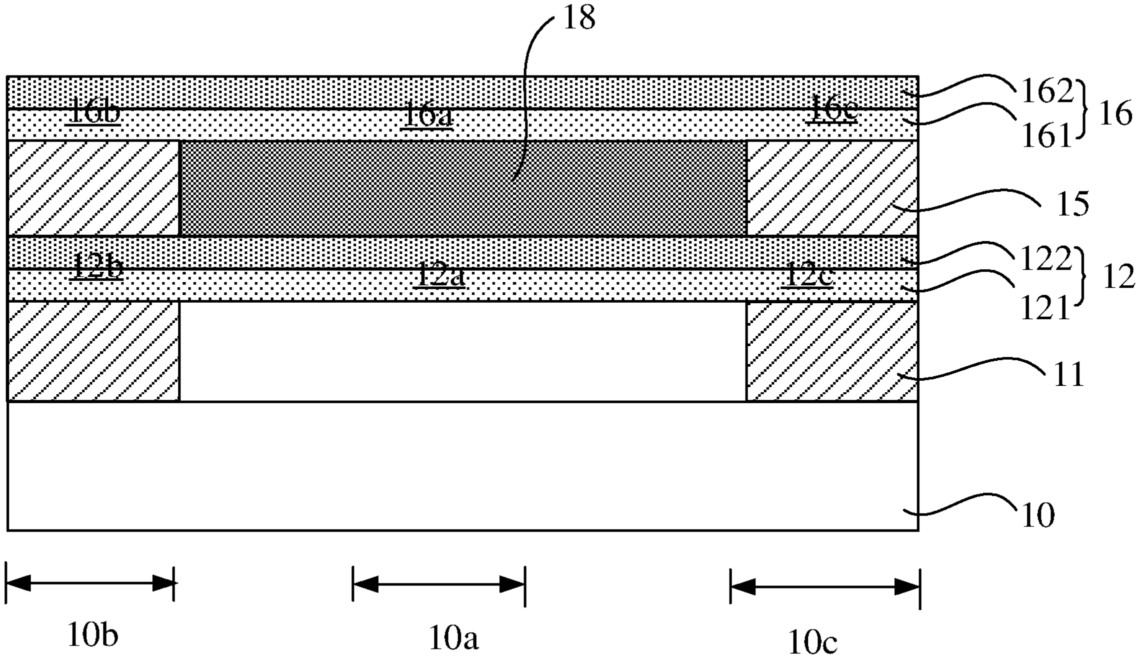

The fifth embodiment of the present application also provides a manufacturing method for the semiconductor device in FIG. 13 to FIG. 14(*c*). FIG. 17 is a flowchart of the manufacturing method. FIG. 18 to FIG. 20 are schematic intermediate structure views corresponding to the processes in FIG. 17.

Referring to FIG. 17, the manufacturing method for the semiconductor device of the fifth embodiment and the manufacturing methods for the semiconductor devices 1 and 2 of the first embodiment and the second embodiment are substantially the same, that is, the steps S1-S4 in the first embodiment are substantially the same as steps S10-S40 in the fifth embodiment, the description thereof is omitted here accordingly. The only difference is that after step S30 of the fifth embodiment, steps S31-S33 as below are implemented.

Step S31, as shown in FIG. 18, forming a second support structure 15 on the first source section 12*b* and the first drain section 12*c*; forming a second sacrificial layer 18 on a part of the first nanowire heterojunction 12 exposed by the second support structure 15.

In this embodiment, forming the second support structure 15 specifically includes: as shown in FIG. 19, growing a second epitaxial layer 15' on the first nanowire heterojunction 12; as shown in FIG. 18, patterning the second epitaxial layer 15', where the second epitaxial layer 15' on the first source section 12*b* and the first drain section 12*c* is retained to form the second support structure 15.

The material of the second epitaxial layer 15' may be a group III nitride-based material, such as at least one of GaN, AlN, InN, AlGaN, InGaN, AlInN, and AlInGaN. Patterning the second epitaxial layer 15' can be achieved by dry etching or wet etching.

In other embodiments, the second epitaxial layer 15' can also be replaced with a second material layer. The material of the second material layer is, for example, silicon nitride, silicon dioxide, silicon oxynitride, etc. The second material layer can be formed by physical vapor deposition or chemical vapor deposition.

In other embodiments, forming the second support structure 15 may specifically include: forming a second patterned mask layer on the first nanowire heterojunction 12, where the second patterned mask layer has a second opening, and the second opening exposes the first source section 12*b* and the first drain section 12*c*; using the second patterned mask layer as a mask to epitaxially grow a second support structure 15 on the first nanowire heterojunction 12. After that, the first patterned mask layer is removed.

The material of the second patterned mask layer is, for example, silicon nitride, silicon dioxide, silicon oxynitride, etc. The second patterned mask layer can be formed by physical vapor deposition or chemical vapor deposition.

The material of the second support structure 15 may be a group III nitride-based material, such as at least one of GaN, AlN, InN, AlGaN, InGaN, AlInN, and AlInGaN.

In this embodiment, forming the second sacrificial layer 18 specifically includes: growing a second sacrificial layer 18 on the second support structure 15 and the first nanowire heterojunction 12 exposed by the second support structure 15, and removing the second sacrificial layer 18 on the second support structure 15.

The material of the second sacrificial layer 18 may be N-type GaN. The epitaxial growth process of the second sacrificial layer 18 may refer to the epitaxial growth process of the nucleation layer and/or the buffer layer. The second sacrificial layer 18 on the second support structure 15 can be removed by dry etching or wet etching.

In other embodiments, the material of the second sacrificial layer 18 may also be, for example, silicon nitride, silicon dioxide, etc. The second sacrificial layer 18 can be formed by a physical vapor deposition method or a chemical vapor deposition method.

In other embodiments, forming the second sacrificial layer 18 may specifically include: growing the second sacrificial layer 18 on the first nanowire heterojunction 12 using the second support structure 15 as a mask. This embodiment is applicable for the case where the material of the second support structure 15 is silicon nitride, silicon dioxide, etc., and the second sacrificial layer 18 cannot be grown on it.

Referring to FIG. 18, in this embodiment, the second sacrificial layer 18 on the first nanowire heterojunction 12 is flush with the upper surface of the second support structure 15. In other embodiments, the upper surface of the second sacrificial layer 18 on the first nanowire heterojunction 12 may be higher than the upper surface of the second support structure 15 or lower than the upper surface of the second support structure 15.

Step S32, as shown in FIG. 20, growing a second nanowire heterojunction 16 on the second support structure 15 and the second sacrificial layer 18. The second nanowire heterojunction 16 includes a second gate section 16*a* corresponding to the first region 10*a*, a second source section 16*b* corresponding to the second region 10*b*, and a second drain section 16*c* corresponding to the third region 10*c*. The second source section 16*b* and the second drain section 16*c* are located on the second support structure 15. A part of the second nanowire heterojunction 16 between the second source section 16*b* and the second drain section 16*c* is located on the second sacrificial layer 18.

The epitaxial growth process of the second nanowire heterojunction 16 can refer to the epitaxial growth process of the nucleation layer and/or the buffer layer.

In some embodiments, the second nanowire heterojunctions 16 may share the second source section 16*b* and/or share the second drain section 16*c*. That is, the second source sections 16*b* of each of the second nanowire heterojunctions 16 are connected together, and/or the second drain sections 16*c* of each of the second nanowire heterojunctions 16 are connected together.

Step S33, referring to FIG. 16, the second sacrificial layer 18 is removed, and the second nanowire heterojunction 16 is suspended.

When the material of the second sacrificial layer 18 is N-type GaN, the removal method is wet solution etching, such as boric acid.

In some embodiments, the material of the second sacrificial layer 18 may be a GaN-based material, and the upper surface is an N-face. The material of the second nanowire heterojunction 16 may also be a GaN-based material, and the upper surface is a Ga-face. The etching solution for wet etching can be $H_3PO_4$ solution or KOH solution, which is corrosive on the N-face and non-corrosive on the Ga-face. GaN crystal is a wurtzite structure, where the Ga, N atomic layers are ABABAB hexagonal stacking layers, each Ga (N) forms a bond with the surrounding 4 N(Ga) atoms in a diamond-like tetrahedral structure. Taking Ga—N bonds parallel to the C axis ([0001] crystal orientation) as a reference, if the Ga atoms in each Ga—N bond are farther away from the lower surface, the upper surface is the Ga-face; if the N atoms in each Ga—N bond are farther away from the lower surface, the upper surface is the N-face. In this embodiment, the second sacrificial layer 18 can be removed by selective etching of the N-face using $H_3PO_4$ solution or KOH solution.

When the material of the second sacrificial layer 18 is silicon nitride, it is removed by hot phosphoric acid; when the material of the second sacrificial layer 18 is silicon dioxide, it is removed by hydrofluoric acid.

Step S40, forming a source 13*b* on the first source section 12*b* and the second source section 16*b*, forming a drain 13*c* on the first drain section 12*c* and the second drain section 16*c*, and forming a ring-shaped gate 13*a* wrapping the first gate section 12*a* and the second gate section 16*a*. The ring-shaped gates 13*a* wrapping each of the first nanowire heterojunctions 12 and the ring-shaped gates 13*a* wrapping each of the second nanowire heterojunctions 16 are separated from each other.

Figure 21:
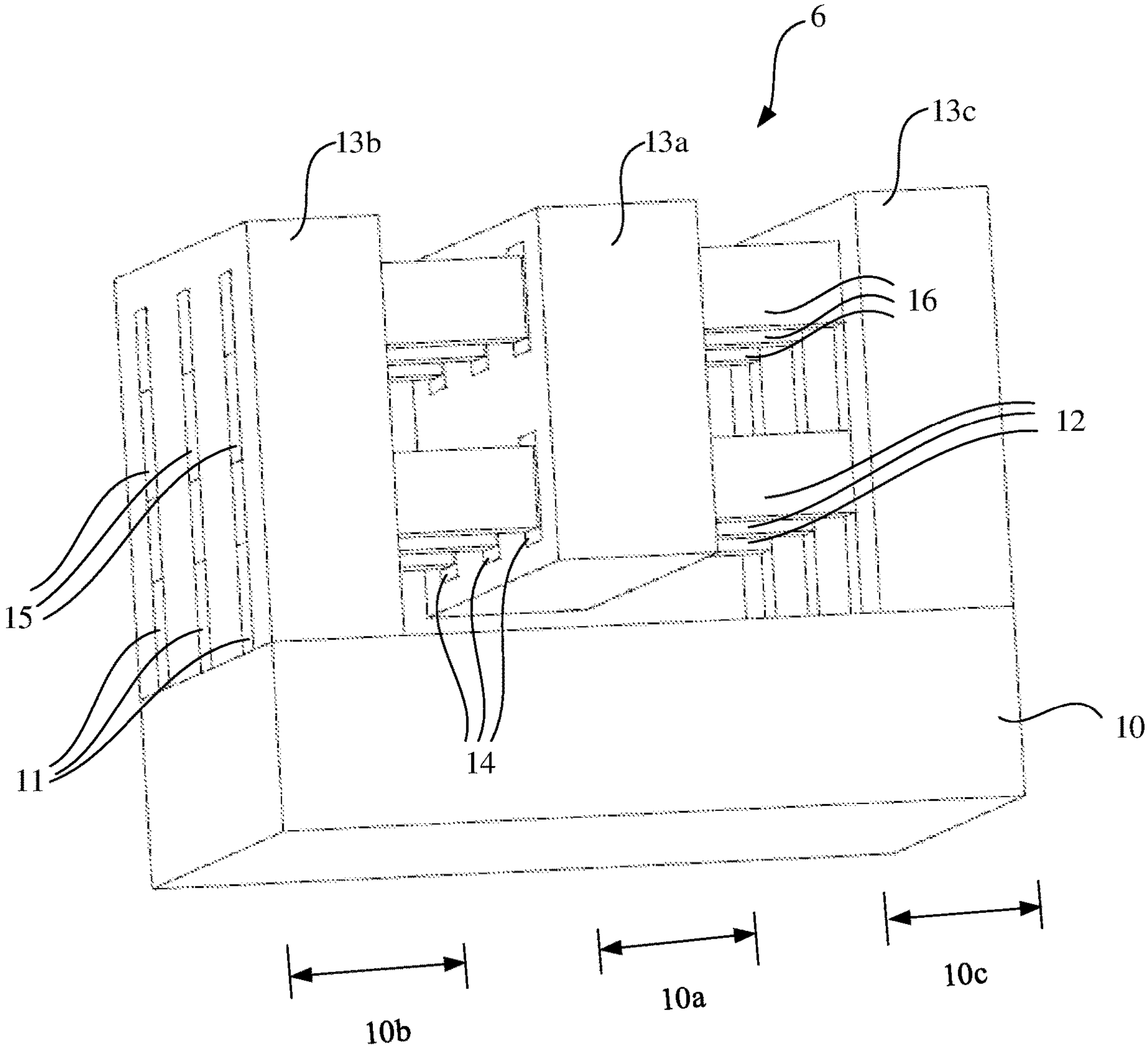
FIG. 21 is a schematic perspective view of a semiconductor device of a sixth embodiment of the present application.

FIG. 21 is a schematic perspective view of a semiconductor device of a sixth embodiment of the present application.

Referring to FIG. 21, a semiconductor device 6 of the sixth embodiment and the manufacturing method thereof and the semiconductor device 5 of the fifth embodiment and the manufacturing method thereof are substantially the same, only except that a ring-shaped gate 13*a* wraps each of the first nanowire heterojunctions 12 and each of the second nanowire heterojunctions 16.

In other embodiments, the ring-shaped gate 13*a* may wrap a second nanowire heterojunction 16 and a first nanowire heterojunction 12 right below the second nanowire heterojunction 16. In other words, the vertical profile of the ring-shaped gate 13*a* is in the shape of "8".

Figure 22:
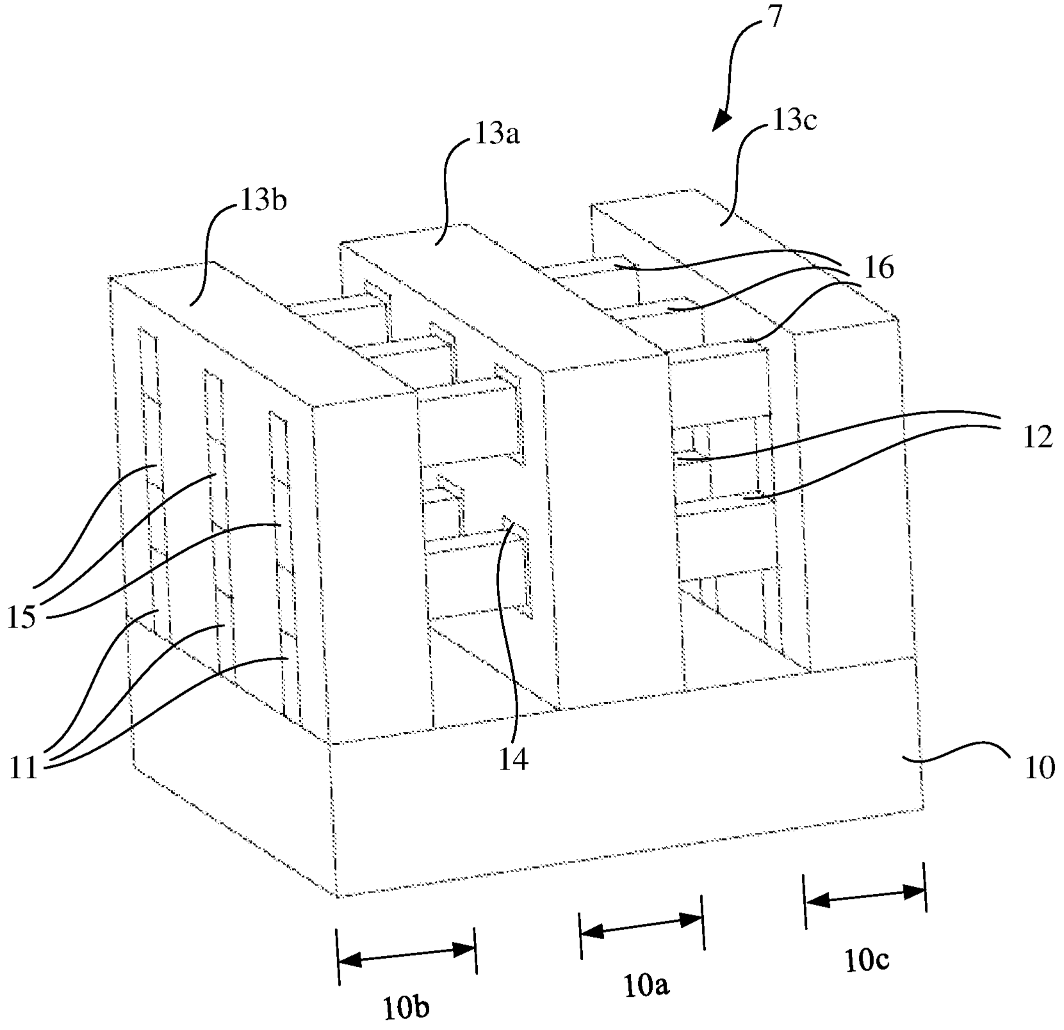
FIG. 22 is a schematic perspective view of a semiconductor device of a seventh embodiment of the present application.

FIG. 22 is a schematic perspective view of a semiconductor device of a seventh embodiment of the present application.

Referring to FIG. 22, a semiconductor device 7 of the seventh embodiment and the manufacturing method thereof are substantially the same as the semiconductor device 6 of the sixth embodiment and the manufacturing method thereof, except that the ring-shaped gate 13*a* contacts the substrate 10.

Figure 23:
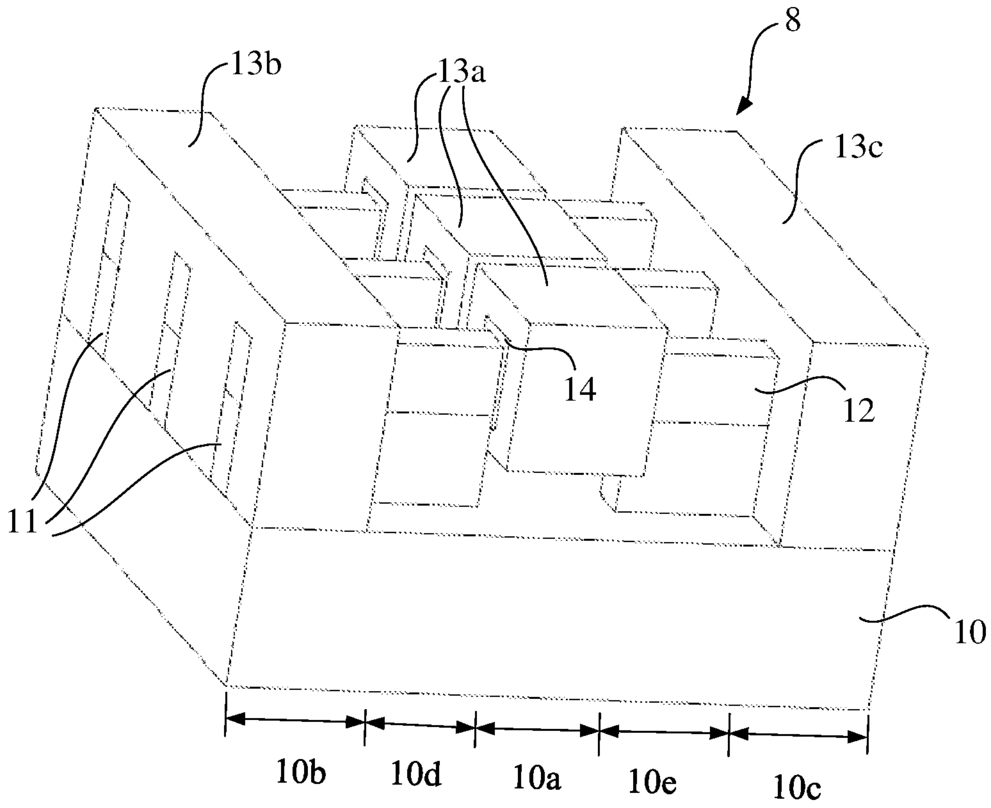
FIG. 23 is a schematic perspective view of a semiconductor device of an eighth embodiment of the present application.
Figure 24:
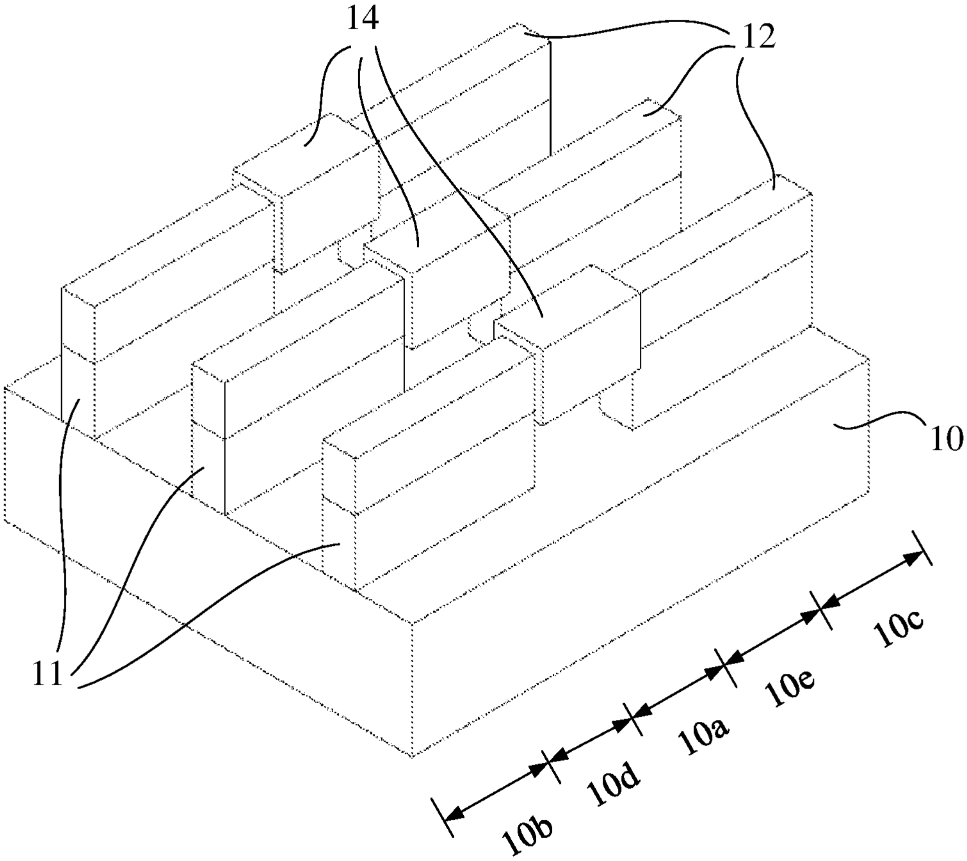
FIG. 24 is a schematic perspective view of the semiconductor structure after removing the source electrode, the drain electrode, and the ring-shaped gate in FIG. 23.
Figure 25:
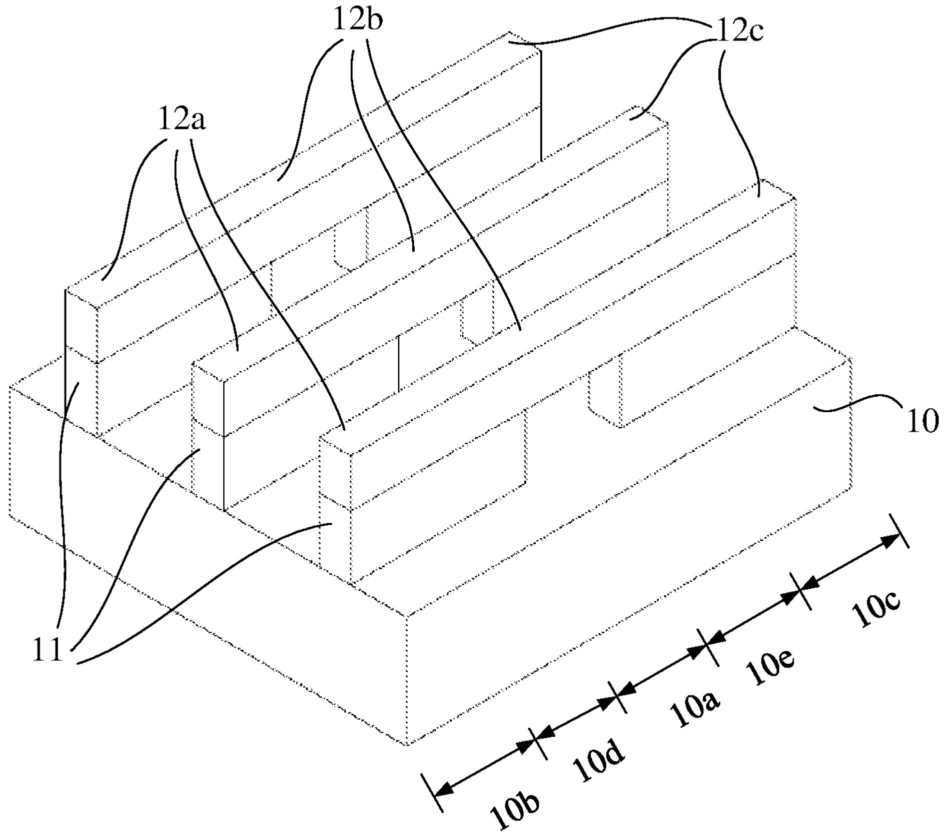
FIG. 25 is a schematic perspective view of the semiconductor structure after removing the gate insulating layer in FIG. 24.

FIG. 23 is a schematic perspective view of a semiconductor device of an eighth embodiment of the present application. FIG. 24 is a schematic perspective view of the semiconductor structure after removing the source electrode, the drain electrode, and the ring-shaped gate in FIG. 23. FIG. 25 is a schematic perspective view of the semiconductor structure after removing the gate insulating layer in FIG. 24.

Referring to FIG. 23 to FIG. 25, a semiconductor device 8 of the eighth embodiment and the manufacturing method thereof are substantially the same as the semiconductor devices 1 and 2 and the manufacturing methods thereof, except that: a substrate 10 further comprises a fourth region 10*d* between the first region 10*a* and the second region 10*b*, and a fifth region 10*e* between the first region 10*a* and the third region 10*c*; the first support structure 11 is located on the second region 10*b* and the fourth region 10*d* and located on the third region 10*c* and the fifth region 10*e*.

As can be seen, the floating section of the first nanowire heterojunction 12 of the semiconductor device 8 is shorter than the floating sections of the first nanowire heterojunction 12 of the semiconductor devices 1 and 2.

In some embodiments, the semiconductor device 8 of the eighth embodiment can be combined with the semiconductor devices 5, 6, and 7 of the fifth, sixth, and seventh embodiments, and the second support structure 15 can be located on the second region 10*b* and the fourth region 10*d*, and be located on the third region 10*c* and the fifth region 10*e*, and may also be located on the second region 10*b* and the third region 10*c*.

Figure 26:
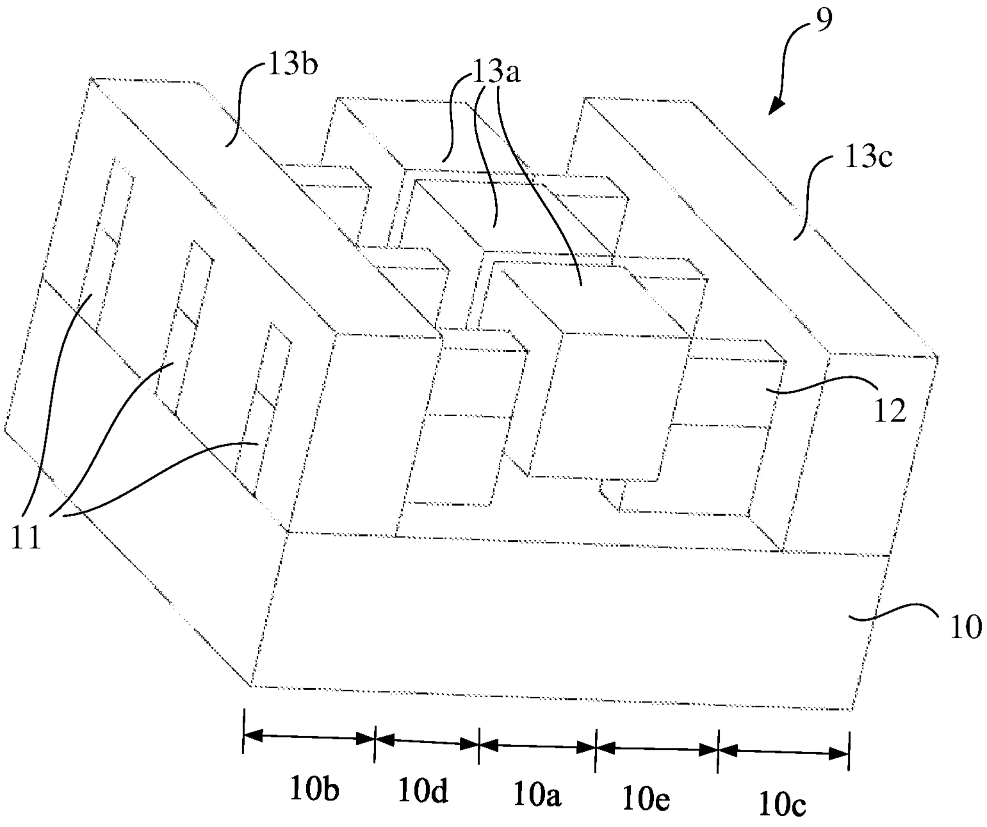
FIG. 26 is a schematic perspective view of a semiconductor device of a ninth embodiment of the present application.

FIG. 26 is a schematic perspective view of a semiconductor device of a ninth embodiment of the present application. Referring to FIG. 26, a semiconductor device 9 of the ninth embodiment and the manufacturing method thereof are substantially the same as the semiconductor device 8 of the eighth embodiment and the manufacturing method thereof, only except that: the ring-shaped gates 13*a* wrapping each of the first nanowire heterojunctions 12 are separated from each other, and/or the gate insulating layer 14 is omitted.

Compared with the prior art, the present application has the following beneficial effects:

1) In semiconductor devices, because the first nanowire heterojunction is confined, the two-dimensional electron gas carriers or two-dimensional hole gas carriers in the heterojunction exhibit approximately one-dimensional transport manner during the migration process. In this way, the carrier mobility can be improved. In addition, the ring-shaped gate's ability to control carriers has also been greatly improved, which can greatly increase the breakdown voltage of the device and reduce the leakage problem and can improve the efficiency and linearity of the radio frequency device.

2) In an alternative solution, a) the first support structure is only located on the second region and the third region; or b) the substrate further includes a fourth region located between the first region and the second region, and a fifth region located between the region and the third region; the first support structure is located on the second region and the fourth region, and on the third region and the fifth region. Compared with the solution b), the advantage of the solution a) is that it can increase the floating section of the first nanowire heterojunction, thus reducing the probability of annihilation that occurs from the carriers and the contact layer in the heterojunction.

3) In an alternative solution, a) the ring-shaped gate directly contacts the first gate section; or b) there is a gate insulating layer between the ring-shaped gate and the first gate section. Compared with solution a), the advantage of solution b) is: MIS gate can reduce gate leakage current.

4) In an optional solution, there are two or more first nanowire heterojunctions, and the two or more first nanowire heterojunctions share the first source section and the first drain section. The advantage is that compared to one first nanowire heterojunction, multiple nanowire heterojunctions are equivalent to providing multiple carrier migration channels, which can further improve the carrier mobility.

5) In an alternative solution, the ring-shaped gates wrapping each of the first nanowire heterojunctions are separated from each other, or the ring-shaped gates wrapping each of the first nanowire heterojunctions are connected together. The advantage is that it can meet different performance requirements.

6) In an optional solution, the semiconductor device further includes: a second nanowire heterojunction stacked on the first nanowire heterojunction. The advantage is that the second nanowire heterojunction is equivalent to providing an additional carrier migration channel, which can further improve the carrier mobility.

Although the present application is disclosed as above, the present application is not limited to this. Any person skilled in the art can make various changes and modifications without departing from the spirit and scope of the present application. Therefore, the protection scope of the present application should be subject to the scope defined by the claims.

What is claimed is:

1. A semiconductor device, comprising:

a substrate, the substrate comprising a first region, and a second region and a third region located on respective sides of the first region;

a first support structure located at least on the second region and the third region;

a first nanowire heterojunction, the first nanowire heterojunction comprising a first gate section corresponding to the first region, a first source section corresponding to the second region, and a first drain section corresponding to the third region; the first source section and the first drain section being located on an upper surface of the first support structure; and a source located on an upper surface of the first source section, a drain located on an upper surface of the first drain section, and a ring-shaped gate wrapping the first gate section, wherein the first nanowire heterojunction is a continuous structural layer that extends at least through the source, the ring-shaped gate and the drain, and the first nanowire heterojunction comprises, from bottom to top, a first channel layer and a first barrier layer that are continuously extending along a length direction of the first nanowire heterojunction, wherein the first nanowire heterojunction comprises a first back barrier layer, the first channel layer, and the first barrier layer from bottom to top; and the first nanowire heterojunction is wrapped by a first anti-scattering layer.

2. The semiconductor device according to claim 1, wherein the first support structure is located only on the second region and the third region; or the substrate further comprises a fourth region located between the first region and the second region, and a fifth region located between the first region and the third region; the first support structure is located on the second region and the fourth region, and is located on the third region and the fifth region.

3. The semiconductor device according to claim 1, wherein a gate insulating layer is further provided between the first gate section and the ring-shaped gate.

4. The semiconductor device according to claim 1, wherein the semiconductor device comprises two or more first nanowire heterojunctions.

5. The semiconductor device according to claim 4, wherein the two or more first nanowire heterojunctions share the first source section and/or the first drain section.

6. The semiconductor device according to claim 4, wherein the ring-shaped gate wrapping each of the two or more first nanowire heterojunctions are separated from each other, or connected together.

7. The semiconductor device according to claim 1, further comprising:

a second support structure located at least on the first source section and the first drain section; and a second nanowire heterojunction, the second nanowire heterojunction comprising a second gate section corresponding to the first region, a second source section corresponding to the second region and a second drain section corresponding to the third region; the second source section and the second drain section being located on the second support structure.

8. The semiconductor device according to claim 7, wherein the semiconductor device comprises two or more second nanowire heterojunctions.

9. The semiconductor device according to claim 8, wherein the two or more second nanowire heterojunctions share the second source section and/or the second drain section.

10. The semiconductor device according to claim 9, wherein the ring-shaped gate wraps one of the second nanowire heterojunctions and one of the first nanowire heterojunctions right below the one of the second nanowire heterojunctions.

11. A manufacturing method for a semiconductor device, comprising:

providing a substrate, the substrate comprising a first region, and a second region and a third region located on respective sides of the first region; forming a first support structure at least on the second region and the third region; forming a first sacrificial layer on the substrate exposed by the first support structure;

growing a first nanowire heterojunction on the first support structure and the first sacrificial layer, the first nanowire heterojunction comprising a first gate section corresponding to the first region, a first source section corresponding to the second region, and a first drain section corresponding to the third region; the first source section and the first drain section being located on the first support structure, at least the first gate section being located on the first sacrificial layer;

removing the first sacrificial layer to suspend the first nanowire heterojunction; and forming a source on the first source section, forming a drain on the first drain section, and forming a ring-shaped gate wrapping the first gate section, wherein the first nanowire heterojunction is a continuous structural layer that extends at least through the source, the ring-shaped gate and the drain, and the first nanowire heterojunction comprises, from bottom to top, a first channel layer and a first barrier layer that are continuously extending along a length direction of the first nanowire heterojunction, wherein the first nanowire heterojunction comprises a first back barrier layer, the first channel layer, and the first barrier layer from bottom to top; and the first nanowire heterojunction is wrapped by a first anti-scattering layer.

12. The method according to claim 11, wherein the first support structure is located only on the second region and the third region; after removing the first sacrificial layer, the suspended first nanowire heterojunction extends from the first source section to the first drain section; or the substrate further comprises a fourth region located between the first region and the second region, and a fifth region located between the first region and the third region; the first support structure is located on the second region and the fourth region, and is located on the third region and the fifth region; after removing the first sacrificial layer, the suspended first nanowire heterojunction is only the first gate section.

13. The method according to claim 11, further comprising: before forming the ring-shaped gate, wrapping a gate insulating layer on the first gate section; the ring-shaped gate wrapping the gate insulating layer.

14. The method according to claim 11, wherein the semiconductor device comprises two or more first nanowire heterojunctions.

15. The method according to claim 11, wherein forming the first support structure comprises:

growing a first epitaxial layer on the substrate; patterning the first epitaxial layer and at least retaining the first epitaxial layer on the second region and the third region to form the first support structure; or forming a first patterned mask layer on the substrate, wherein the first patterned mask layer has a first opening, and the first opening exposes at least the second region and the third region; epitaxially growing the first support structure on the substrate using the first patterned mask layer as a mask.

16. The method according to claim 11, wherein forming the first sacrificial layer comprises:

growing a first sacrificial layer on the first support structure and the substrate exposed by the first support structure, removing the first sacrificial layer on the first support structure; or growing a first sacrificial layer on the substrate using the first support structure as a mask.

17. The method according to claim 11, further comprising:

forming a second support structure at least on the first source section and the first drain section; forming a second sacrificial layer on the first nanowire heterojunction exposed by the second support structure;

growing a second nanowire heterojunction on the second support structure and the second sacrificial layer, wherein the second nanowire heterojunction comprises a second gate section corresponding to the first region, a second source section corresponding to the second region and a second drain section corresponding to the third region; the second source section and the second drain section is located on the second support structure, at least the second gate section is located on the second sacrificial layer; and removing the second sacrificial layer and suspending the second nanowire heterojunction.

18. The method according to claim 17, wherein forming the second support structure comprises:

growing a second epitaxial layer on the first heterojunction nanowire; patterning the second epitaxial layer and at least retaining the second epitaxial layer on the first source section and the first drain section to form the second support structure; or forming a second patterned mask layer on the first nanowire heterojunction, the second patterned mask layer having a second opening, and the second opening at least exposing the first source section and the first drain section; epitaxially growing the second support structure on the first nanowire heterojunction using the second patterned mask layer as a mask.

19. The method according to claim 17, wherein forming the second sacrificial layer comprises:

growing a second sacrificial layer on the second support structure and the substrate exposed by the second support structure, removing the second sacrificial layer on the second support structure; or growing a second sacrificial layer on the substrate using the second support structure as a mask.

* * * * *